United States Patent
Whiteley et al.

(10) Patent No.: US 11,714,231 B2
(45) Date of Patent: *Aug. 1, 2023

(54) SILICON CARBIDE AND NITRIDE STRUCTURES ON A SUBSTRATE

(71) Applicant: The Boeing Company, Chicago, IL (US)

(72) Inventors: Samuel J. Whiteley, Santa Monica, CA (US); Daniel Yap, Newbury Park, CA (US); Edward H. Chen, Los Angeles, CA (US); Danny M. Kim, Agoura Hills, CA (US); Thaddeus D. Ladd, Woodland Hills, CA (US)

(73) Assignee: The Boeing Company, Chicago, IL (US)

( * ) Notice: Subject to any disclaimer, the term of this patent is extended or adjusted under 35 U.S.C. 154(b) by 336 days.

This patent is subject to a terminal disclaimer.

(21) Appl. No.: 16/874,619

(22) Filed: May 14, 2020

(65) Prior Publication Data

US 2021/0356658 A1 Nov. 18, 2021

(51) Int. Cl.
*G02B 6/12* (2006.01)
*G02B 6/122* (2006.01)

(52) U.S. Cl.
CPC .. *G02B 6/1223* (2013.01); *G02B 2006/12035* (2013.01)

(58) Field of Classification Search
CPC .............. G02B 6/1223; G02B 2006/12035
USPC .......................................................... 385/14
See application file for complete search history.

(56) References Cited

U.S. PATENT DOCUMENTS

| | | | | |
|---|---|---|---|---|
| 5,880,491 A | * | 3/1999 | Soref | H01L 33/007 257/190 |
| 6,391,799 B1 | * | 5/2002 | Di Cioccio | H01L 21/76254 438/445 |
| 8,105,916 B2 | * | 1/2012 | Faure | H01L 21/76251 257/190 |
| 8,252,664 B2 | * | 8/2012 | Letertre | H01L 21/187 438/458 |
| 10,629,689 B1 | | 4/2020 | Raring et al. | |
| 2006/0014310 A1 | | 1/2006 | Epler et al. | |
| 2008/0169483 A1 | * | 7/2008 | Kasai | H01L 22/26 257/E21.407 |
| 2016/0103278 A1 | * | 4/2016 | Cheng | H01L 31/105 438/24 |
| 2017/0025530 A1 | | 1/2017 | Cooper, Jr. | |
| 2020/0058628 A1 | | 2/2020 | Slovin et al. | |
| 2021/0063779 A1 | * | 3/2021 | Janta-Polczynski | G02F 1/0955 |
| 2021/0398804 A1 | * | 12/2021 | Lukin | H01L 21/76251 |

OTHER PUBLICATIONS

"Realizing multi-functional all optical data processing on nanoscale SiC waveguides" by Syu et al., Nature, Scientific Reports, 8: 14859, pp. 1-14, 2018 (Year: 2018).*

(Continued)

*Primary Examiner* — Robert Tavlykaev
(74) *Attorney, Agent, or Firm* — Yee & Associates, P.C.

(57) ABSTRACT

A semiconductor structure comprises a substrate; an oxide layer on the substrate; a set of group III nitride layers on the oxide layer; and a set of silicon carbide layers located on the set of group III nitride layers.

9 Claims, 18 Drawing Sheets

(56) References Cited

OTHER PUBLICATIONS

"Asymmetrically and Vertically Coupled Hybrid Si/GaN Microring Resonators for On-Chip Optical Interconnects" by Thubthimthong et al, IEEE Photonics Journal "HMRs for On-Chip Optical Interconnects", vol. 7, No. 4, paper 7801511 (Year: 2015).*

"Efficient Generation of an Array of Single Silicon-Vacancy Defects in Silicon Carbide" by Wang et al, Physical Review Applied, vol. 7, paper 064021, pp. 1-6 (Year: 2017).*

"Wafer Direct Bonding: From Advanced Substrate Engineering to Future Applications in Micro/Nanoelectronics" by Christiansen et al, Proceedings of the IEEE, vol. 94, No. 12, pp. 2060-2102 (Year: 2006).*

"Optical characterization of GaN/SiC n—p heterojunctions and p—SiC" by Torvik et al, Applied Physics Letters, vol. 72, No. 8, pp. 945-947 (Year: 1998).*

Pavunny et al., "On the doping concentration dependence and dopant selectivity of photogenerated carrier assisted etching etching of 4H—SiC epilayers," Electrochimica Acta, 2019, vol. 323, 6 pages.

Bracher et al., "Fabrication of High-Q Nanobeam Photonic Crystals in Epitaxially Grown 4H—SiC," Nano Letters, American Chemical Society, 2015, vol. 15, pp. 6202-6207.

Crook et al., "Purcell enhancement of a single silicon carbide color center with coherent spin control," Nano Letters, Mar. 2020, 13 pages.

Lukin et al., "4H-silicon-carbide-on-insulator for integrated quantum and nonlinear photonics," Nature Photonics, 2020, vol. 14, pp. 330-334.

Zheng et al., "High-quality factor, high-confinement microring resonators in 4H silicon carbide-on-insulator," Optic Express, Apr. 2019, vol. 27, No. 9, 8 pages.

Non-Final Office Action regarding U.S. Appl. No. 16/874,588, dated Oct. 28, 2021, 8 pages.

Notice of Allowance regarding U.S. Appl. No. 16/874,588, dated Oct. 28, 2021, 8 pages.

Lemettinen et al., "MOVPE growth of nitrogen- and aluminum-polar AlN on 4H—SiC," Journal of Crystal Growth, Apr. 2018, vol. 487, pp. 50-56.

Di Cioccio et al., "Silicon carbide on insulator formation using the Smart Cut process," Electronics Letters, Jun. 6, 1996, vol. 32. No. 12, pp. 1144-1145.

Bracher et al., "Selective Purcell enhancement of two closely linked zero-phonon transitions of a silicon carbide color center," PNAS, Apr. 18, 2017, vol. 114, No. 16, pp. 4060-4065.

Anderson et al., "Electrical and optical control of single spins integrated in scalable semiconductor devices," Science Magazine, Dec. 2019, vol. 366, pp. 1225-1230.

Shishkin et al., "Photoelectrochemical etching of n-type 4H silicon carbide," Journal of Applied Physics, Aug. 2004, vol. 96, No. 4, pp. 2311-2322.

Shor et al., "Photoelectrochemical conductivity selective etch stops for SiC," Applied Physics Letters, 1992, vol. 60, pp. 1001-1003.

Soltani et al., "AlGaN/AlN integrated photonics platform for the ultraviolet and visible spectral range," Optics Express, Oct. 2016, vol. 24, No. 22, 9 pages.

Song et al., "Ultrahigh-Q photonic crystal nanocavities based on 4H silicon carbide," Optica, Aug. 2019, vol. 6, No. 8, 5 pages.

Powell et al., "High-Q suspended optical resonators in 3C silcon carbide obtained by thermal annealing," Optics Express, Feb. 2020, vol. 28, No. 4, 12 pages.

Fan et al., "High-Q integrated photonic microresonators on 3C—SiC-on-insulator (SiCOI) platform," Optics Express, Oct. 2018, vol. 26, No. 20, 13 pages.

Fan et al., "High-quality integrated microdisk resonators in the visible-to-near-infrared wavelength range on a 3C-silicon carbide-on-insulator platform," Optics Letters, Jan. 2020, vol. 45, No. 1, 4 pages.

Extended European Search Report regarding European Application No. 21173648.3, 9 pages, dated Oct. 12, 2021.

* cited by examiner

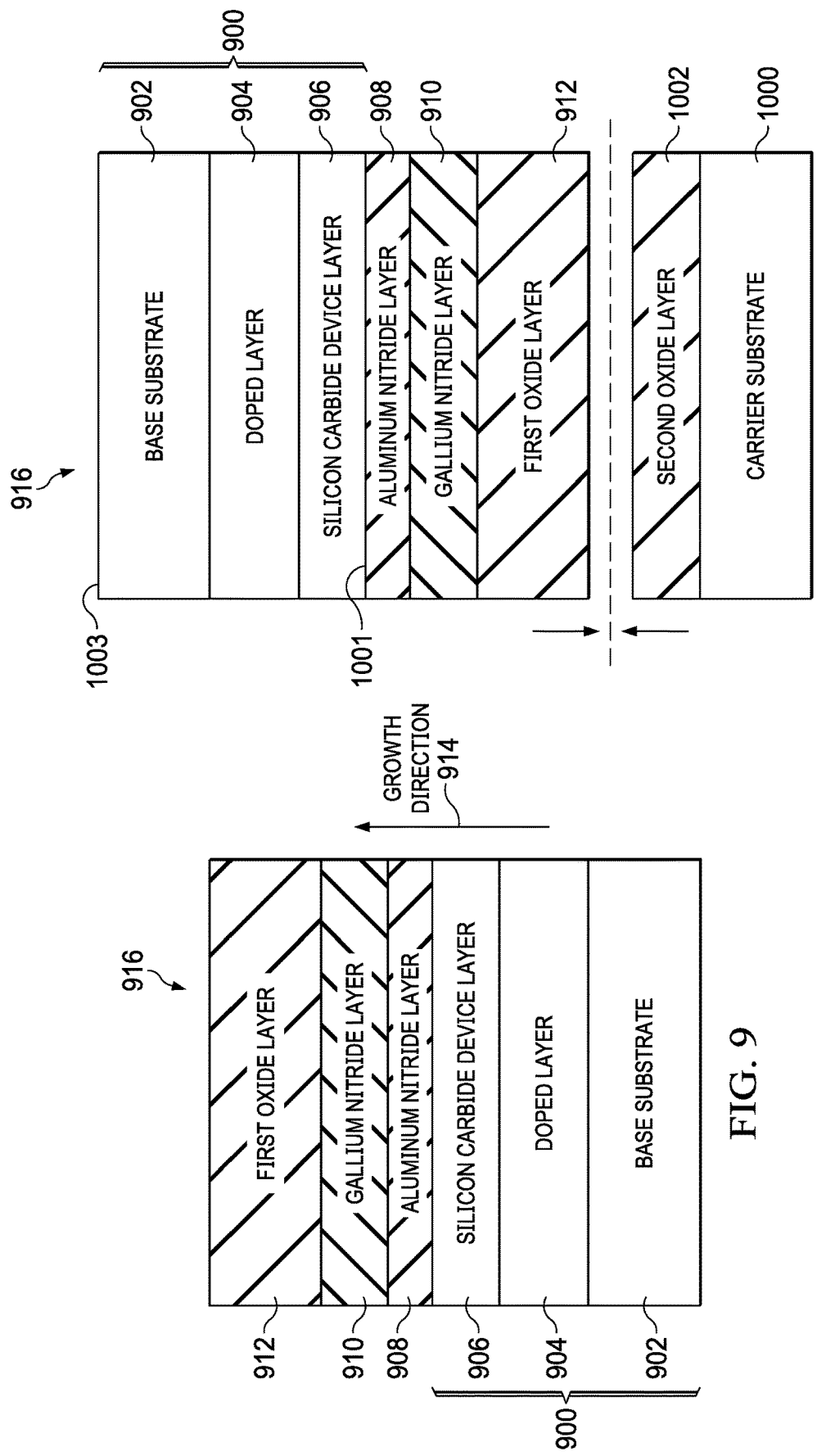

SILICON CARBIDE AND NITRIDE STRUCTURES ON A SUBSTRATE

CROSS-REFERENCE TO RELATED APPLICATION

This application is related to the following patent application: entitled "Fabricating a Silicon Carbide and Nitride Structures on a Carrier Substrate", U.S. Ser. No. 16/874,588, filed even date herewith, now U.S. Pat. No. 11,361,964, issued Jun. 14, 2022, assigned to the same assignee, and incorporated herein by reference.

BACKGROUND INFORMATION

1. Field

The present disclosure relates generally to semiconductors and, in particular, to a method for forming semiconductor structures and, in particular, to forming silicon carbide and nitride structures on a carrier substrate.

2. Background

Silicon carbide and group III nitrides, such as gallium nitride, are desirable semiconductors for signal processing and quantum applications. These materials have wide bandgaps greater than 3 eV and greater nonlinear optical coefficients as compared to other material such as silicon, silica, and silicon nitride materials currently used for low-loss photonics and on-chip nonlinear optics.

Silicon carbide (SiC) is a semiconductor material containing silicon and carbon. Silicon carbide can be used in devices for quantum information processing as well as for other purposes. For example, color centers in silicon carbide structures can be used to provide an optical readout indicative of their electron spin state. Each color center is a qubit in quantum computing. A state of the qubit can be a logic "0", a logic "1", or a superposition of the two states. For example, the color centers can be incorporated in photonic devices such as micro-cavities for waveguide elements.

Fabricating devices on silicon carbide structures can be challenging. For example, the devices formed using thin-films with silicon carbide and group III nitrides can be more difficult to fabricate than desired as compared to other materials such as silicon. A thin-film device includes one or more thin-film layers in which a thin-film layer can be from fractions of a nanometer to several micrometers in thickness.

The quality of thin-film devices using silicon carbide and group III nitrides formed on a wafer may not be as great as desired as compared to materials such as silicon. Therefore, it would be desirable to have a method and apparatus that take into account at least some of the issues discussed above, as well as other possible issues. For example, it would be desirable to have a method and apparatus that overcome a technical problem with forming silicon carbide and group III nitride structures having a desired quality.

SUMMARY

An embodiment of the present disclosure provides a semiconductor structure comprising a substrate, an oxide layer on the substrate, a set of group III nitride layers on the oxide layer, and a set of silicon carbide layers on the set of group III nitride layers.

Another embodiment of the present disclosure provides a semiconductor structure comprising a substrate, an oxide layer on the substrate, and a set of silicon carbide layers on the substrate.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 9 is an illustration of a cross-sectional view of a substrate in accordance with an illustrative embodiment;

FIG. 10 is an illustration of a cross-sectional view for bonding a workpiece to a carrier substrate in accordance with an illustrative embodiment;

DETAILED DESCRIPTION

Figure 1:
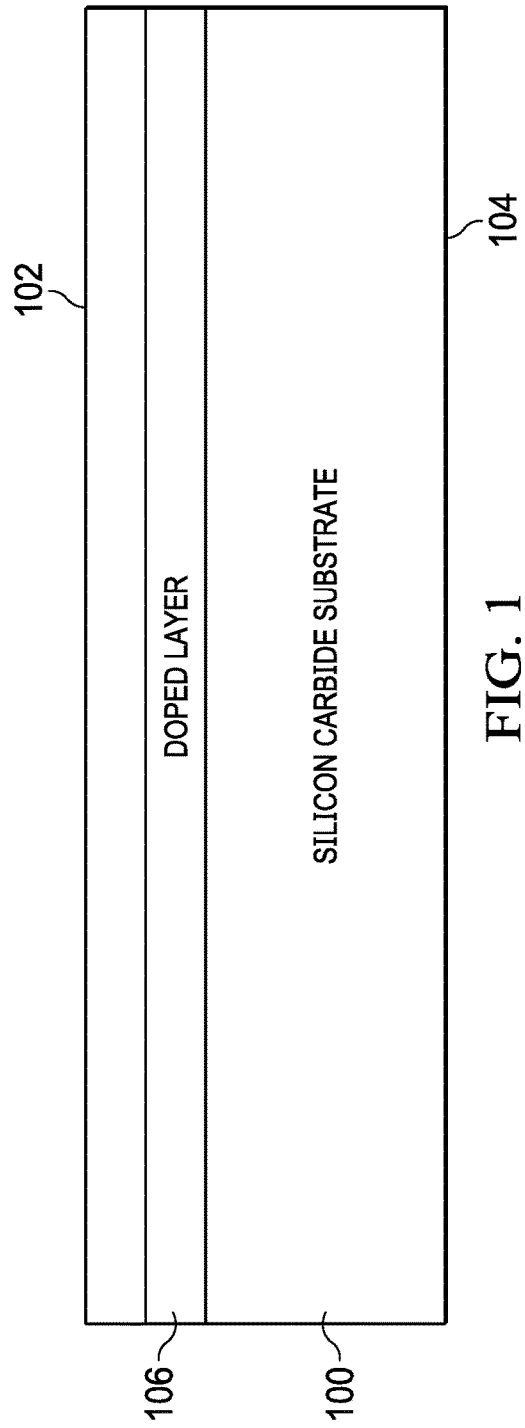
FIG. 1 is an illustration of a cross-sectional view of a silicon carbide substrate in accordance with an illustrative embodiment.

The illustrative embodiments recognize and take into account one or more different considerations. For example, the illustrative embodiments recognize and take into account that currently used techniques can yield polycrystalline films of non-uniform silicon carbide across a wafer. Further, the illustrative embodiments recognize and take into account that when using current techniques to obtain a desired thickness for thin-film devices, material damage can occur in a silicon carbide film, thus leading to undesired optical absorption or scattering.

Further, the illustrative embodiments recognize and take into account that current techniques for fabricating silicon carbide (SiC) nano-photonics have primarily been restricted to 3C-SiC (cubic crystal structure) that is epitaxially grown on silicon (Si). The illustrative embodiments recognize and take into account that while 3C-SiC is simple to undercut on Si or silicon dioxide (SiO2) because of the chemical etch selectivity between SiC and Si/SiO2, 3C—SiC devices can suffer from undesired optical losses that arise from dislocations, residual doping, high film strain, and interfacial defects at the Si—SiC growth interface.

The illustrative embodiments recognize and take into account that in order to mitigate interfacial defects, the 3C-SiC can be transferred to another substrate and a previous interface can be etched away. However, the illustrative embodiments recognize and take into account that the 3C-SiC contains a high inhomogeneous strain because of lattice mismatch with the Si substrate. In contrast to 3C-SiC films grown on Si substrates, the illustrative embodiments recognize and take into account that a single crystalline bulk and homoepitaxially grown 4H-SiC and 6H-SiC (hexagonal crystal structure) contain lower crystal strain and lower residual doping from growth. Therefore, the illustrative embodiments recognize and take into account that a 4H-SiC platform has great potential for photonics and other related fields. The illustrative embodiments recognize and take into account that the hexagonal SiC polytypes of silicon carbide, for example, 4H-, have also been pursued for photonics since the homoepitaxial growth of 4H-SiC on silicon carbide substrates yields crystalline material with very few lattice defects. The illustrative embodiments recognize and take into account that existing methods for isolating thin-films of 4H-SiC are limited given the material is grown on a bulk 4H-SiC substrate, such that currently used chemical etching of the base substrate is not possible.

The illustrative embodiments recognize and take into account that thin-films of hexagonal silicon carbide are suitable for photonics applications while allowing flexible pattern design and stacked layers. Thus, the illustrative embodiments provide a method, apparatus, and system for forming structures using silicon carbide and nitrides, such as group III nitrides, with a desired level of uniformity in film thickness while reducing damage or defects. In one illustrative example, a method forms a semiconductor structure. A first oxide layer located on a set of group III nitride layers formed on a silicon carbide substrate is bonded to a second oxide layer located on a carrier substrate to form an oxide layer located between a carrier substrate and the set of group III nitride layers. The silicon carbide substrate has a doped layer. The silicon carbide substrate having the doped layer is etched using a photo-electrochemical etching process, wherein a doping level of the doped layer is such that the doped layer is removed and a silicon carbide layer in the silicon carbide substrate remains unetched. The semiconductor structure can be formed using the silicon carbide layer and the set of group III nitride layers.

One or more illustrative examples enable fabricating semiconductor structures using silicon carbide as a platform to provide photonic functions. The semiconductor structures include at least one of an optical waveguide and an optical resonator. Functions of these structures include being a splitter, a directional coupler, a grating coupler, a micro-ring for a filter, a micro-disc for a filter, a non-linear optical frequency converter, a light emitter, and other types of functions. The illustrative examples enable fabricating these and other types of structures using wafer scale silicon carbide thin-films while preserving low optical loss.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive.

Further, the figures are not necessarily to scale, as some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper," "lower," "right," "left," "vertical," "horizontal," "top," "bottom," and derivatives thereof shall relate to the illustrative examples in the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element.

In this disclosure, when an element, such as a layer, a region, or a substrate, is referred to as being "on" or "over" another element, the element can be directly on the other element or intervening elements can also be present. In contrast, when an element is referred to as being "directly on," "directly over," or "on and in direct contact with" another element, no intervening elements are present, and the element is in contact with the other element.

The processes, steps, and structures described below do not form a complete process flow for manufacturing integrated circuits. The disclosure can be practiced in conjunction with integrated circuit fabrication techniques currently used in the art, and only so much of the commonly practiced process steps are included as necessary for an understanding of the different examples of the present disclosure. The figures represent cross-sections of a portion of an integrated circuit during fabrication and are not drawn to scale, but instead are drawn so as to illustrate different illustrative features of the disclosure.

In the illustrative examples, processes for manufacturing semiconductor structures can utilize two or more layers of silicon carbide having different doping types. The silicon carbide layers are epitaxially grown on a base silicon carbide substrate in the form of a wafer in the illustrative example. One or more of the silicon carbide layers can be doped by implantation. The silicon carbide layers with the base silicon carbide substrate can be referred to collectively as a silicon carbide substrate. Further, a layer of epitaxial group III nitride can be grown above the top-most silicon carbide layer in the silicon carbide substrate.

Further, one or more optional layers of epitaxial group III nitride layers can be present or grown on the first group III nitride layer. Examples of group III nitride layers that can be used include, for example, aluminum nitride (AlN), gallium nitride (GaN), aluminum gallium nitride (AlGaN), and other group III nitrides.

In the illustrative example, features can be at least one of patterned and etched into the group III nitride layers or deposited on the group III nitride layers. The top of this structure can be covered with a lower-refractive-index insulator such as an oxide layer formed from silicon dioxide. The oxide layer is a layer of silicon dioxide that can be deposited on a carrier substrate also in the form of a wafer. Both wafers are bonded together in the illustrative example.

In the illustrative example, an initial base silicon carbide substrate can be removed, at least partially, by grinding. In these depicted examples, the grinding can be at least one of mechanical grinding, polishing, or chemical-mechanical polishing (CMP). Mechanical grinding of the silicon carbide substrate can result in a silicon carbide layer that may have non-uniform thickness. The uniformity can become lower when the grinding is performed over distances measured in centimeters.

Afterwards, photo-electrochemical (PEC) etching can be performed to selectively remove the exposed, non-uniform silicon carbide layer until an etch-stop silicon carbide layer is reached. The photo-electrochemical etching can be performed from either a carbon-face or a silicon-face of the silicon carbide substrate in this example. A silicon carbide is a crystalline material and can have a silicon-face or a carbon-face, depending on the orientation. This silicon carbide layer functions as an etch-stop and can be at least one of semi-insulating or a different doping polarity as compared to the silicon carbide material being removed using photo-electrochemical (PEC) etching.

In the illustrative example, the resulting set of silicon carbide layers on the set of group III nitride layers can be made thinner than 1 µm and, in some cases, can be thinner than 50 nm using the techniques in the illustrative examples.

In the illustrative example, additional planarization steps can be used. For example, mechanical polishing or chemical-mechanical polishing may be performed after at least one of material growth or photo-electrochemical (PEC) etching of the silicon carbide layer substrate. These processes can be performed to reduce roughness at various interfaces.

With reference now to FIGS. 1-8, illustrations of cross-sections in a process to form a semiconductor structure are depicted in accordance with an illustrative embodiment. In FIG. 1, an illustration of a cross-sectional view of a silicon carbide substrate is depicted in accordance with an illustrative embodiment. As depicted, silicon carbide (SiC) substrate 100 can be in the form of a wafer. For example, silicon carbide substrate 100 can be a hexagonal silicon carbide wafer. The silicon carbide material can be, for example, a 4H or 6H crystal polytype in this example. As depicted, in this example, the silicon carbide material has a crystalline structure that is non-centrosymmetric and polar. As depicted, the wafer can, for example, have an area of 25 square centimeters or greater.

In this illustrative example, silicon carbide substrate 100 has bond face 102 and etch face 104. More specifically, etch face 104 can be either a carbon-face or a silicon-face of silicon carbide substrate 100. In this example, bond face 102 is the surface on which additional materials for a semiconductor structure are formed.

Additionally, silicon carbide substrate 100 has doped layer 106. The doping to form doped layer 106 can be performed using any currently available doping techniques including at least one of diffusion or ion implantation. Doped layer 106 can be a layer from about 50 nanometers to tens of micrometers in thickness.

In this illustrative example, doped layer 106 can be a p-type layer or an n-type silicon carbide layer. The doping concentration is such that doped layer 106 can be etched using a photo-electrochemical etching process. In this illustrative example, the doping is such that doped layer 106 is etched by the photo-electrochemical etching process while other portions of silicon carbide substrate 100 under doped layer 106 and in direct contact with doped layer 106 remain unetched.

Figure 2:
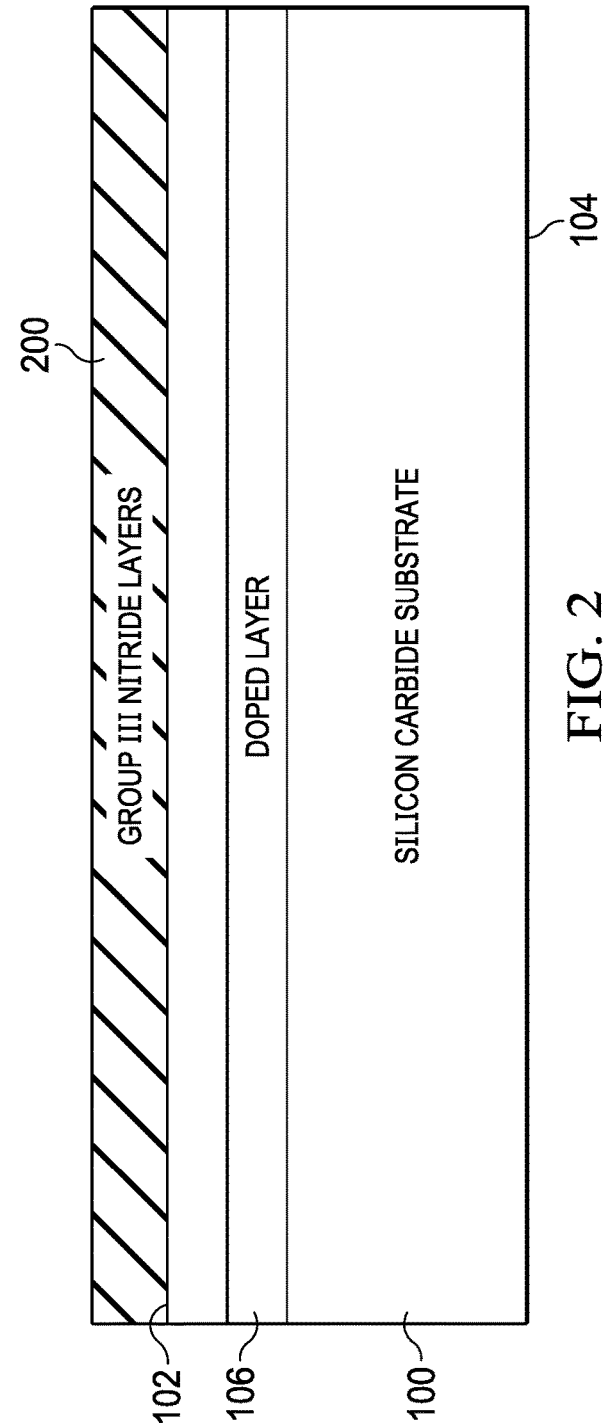
FIG. 2 is an illustration of a cross-sectional view of a set of group III nitride layers on a silicon carbide substrate in accordance with an illustrative embodiment.

Turning next to FIG. 2, an illustration of a cross-sectional view of a set of group III nitride layers on a silicon carbide substrate is depicted in accordance with an illustrative embodiment. In the illustrative examples, the same reference numeral may be used in more than one figure. This reuse of a reference numeral in different figures represents the same element in the different figures.

As depicted, in this example, a set of group III nitride layers 200 are grown on bond face 102 of silicon carbide substrate 100. The set of group III nitride layers 200 can be grown using currently available techniques for forming nitride layers.

As used herein, "a set of," when used with reference to items, means one or more items. For example, "a set of group III nitride layers 200" is one or more of group III nitride layers 200. As depicted, the set of group III nitride layers 200 can be thin-film layers in which each of these thin-film layers is from fractions of a nanometer to several micrometers in thickness. For example, a thin-film layer can be less than one micrometer.

In this illustrative example, the set of group III nitride layers 200 comprises at least one of gallium nitride (GaN), aluminum nitride (AlN), indium nitride (InN), indium aluminum gallium nitride (InAlGaN), or other suitable group III nitrides. In this example, the set of group III nitride layers 200 comprises an AlN layer that is at least 10 nanometers thick. Additional AlN, GaN, or $Al_xGa_{1-x}N$ layers can be optionally grown on top of this layer. These additional layers can be, for example, nanometers to several hundreds of microns thick. The number 'x' represents the Al:Ga ratio for the material's stoichiometry and 'x' can have a value between 0 and 1 in this example.

Figure 3:
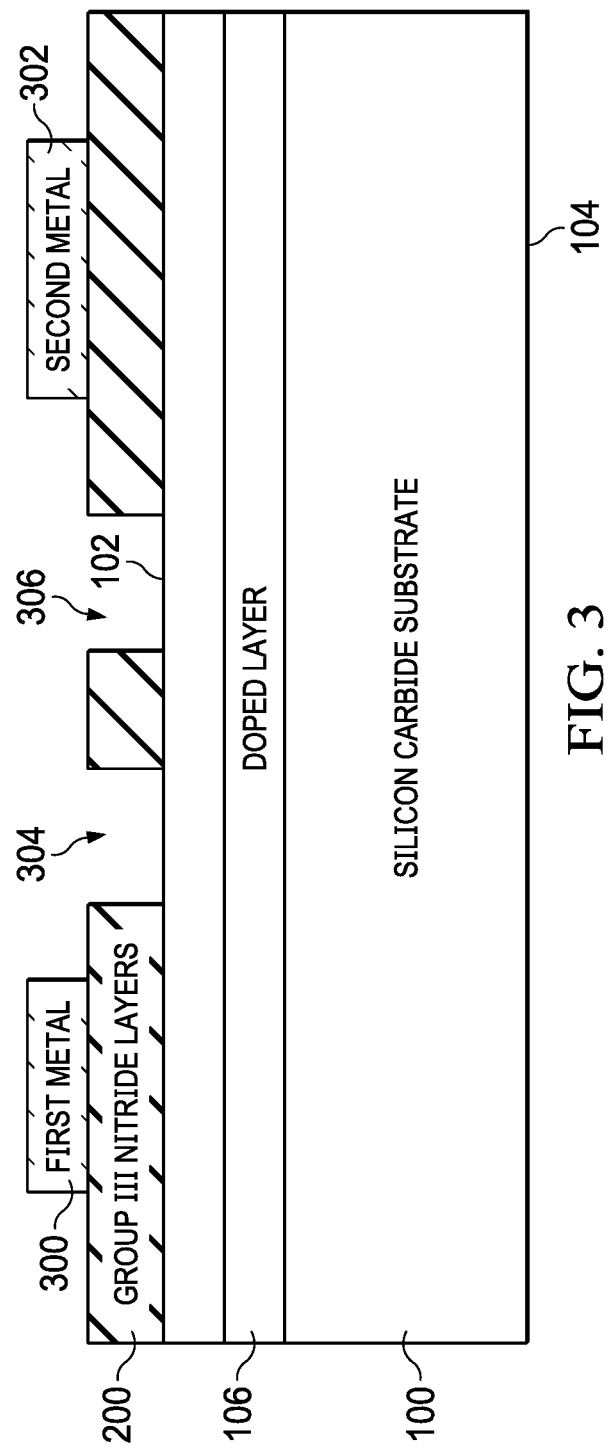
FIG. 3 is an illustration of a cross-sectional view of structures formed using a set of group III nitride layers in accordance with an illustrative embodiment.

Turning next to FIG. 3, an illustration of a cross-sectional view of structures formed using a set of group III nitride layers is depicted in accordance with an illustrative embodiment. As depicted, first metal 300 and second metal 302 are formed on a set of group III nitride layers 200. First metal 300 and second metal 302 can be formed using currently known techniques including industry-standard lithography and deposition techniques.

Additionally, the set of group III nitride layers 200 can be patterned and etched using currently known techniques such as defining a hard mask, etching the group III nitride material, and removing the hard mask. In this example, the patterning in etching forms first opening 304 and second opening 306 in the set of group III nitride layers 200 to expose bond face 102.

Figure 4:
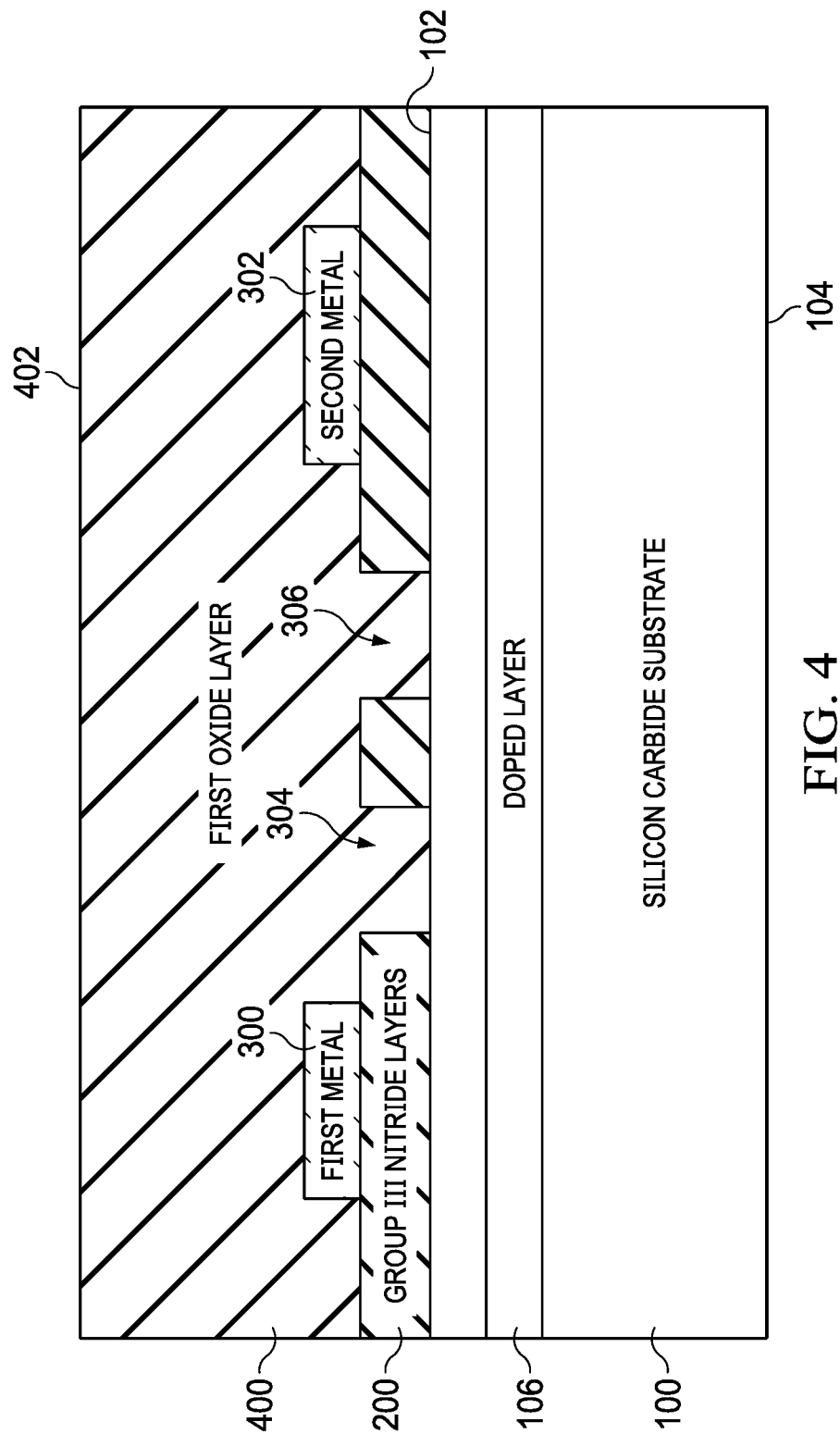
FIG. 4 is an illustration of a cross-sectional view of silicon dioxide deposited on a silicon carbide substrate covering structures formed on a bond face of the silicon carbide substrate in accordance with an illustrative embodiment.

With reference now to FIG. 4, an illustration of a cross-sectional view of silicon dioxide deposited on a silicon carbide substrate covering structures formed on a bond face of the silicon carbide substrate is depicted in accordance with an illustrative embodiment. In this illustrative example, first oxide layer 400 is silicon dioxide that is deposited on first metal 300, second metal 302, a set of group III nitride layers 200, and bond face 102 exposed in first opening 304 and second opening 306 of the set of group III nitride layers 200. The deposition of silicon dioxide to form first oxide layer 400 can be performed using known techniques such as plasma enhanced chemical vapor deposition, sputtering, or another suitable, known technique for forming first oxide layer 400.

As depicted, first oxide layer 400 has first surface 402. In this example, first surface 402 can be processed using chemical-mechanical polishing (CMP) to improve planarity and reduce surface roughness. Further, first surface 402 of first oxide layer 400 can be treated or activated to be a hydrophilic surface.

Figure 5:
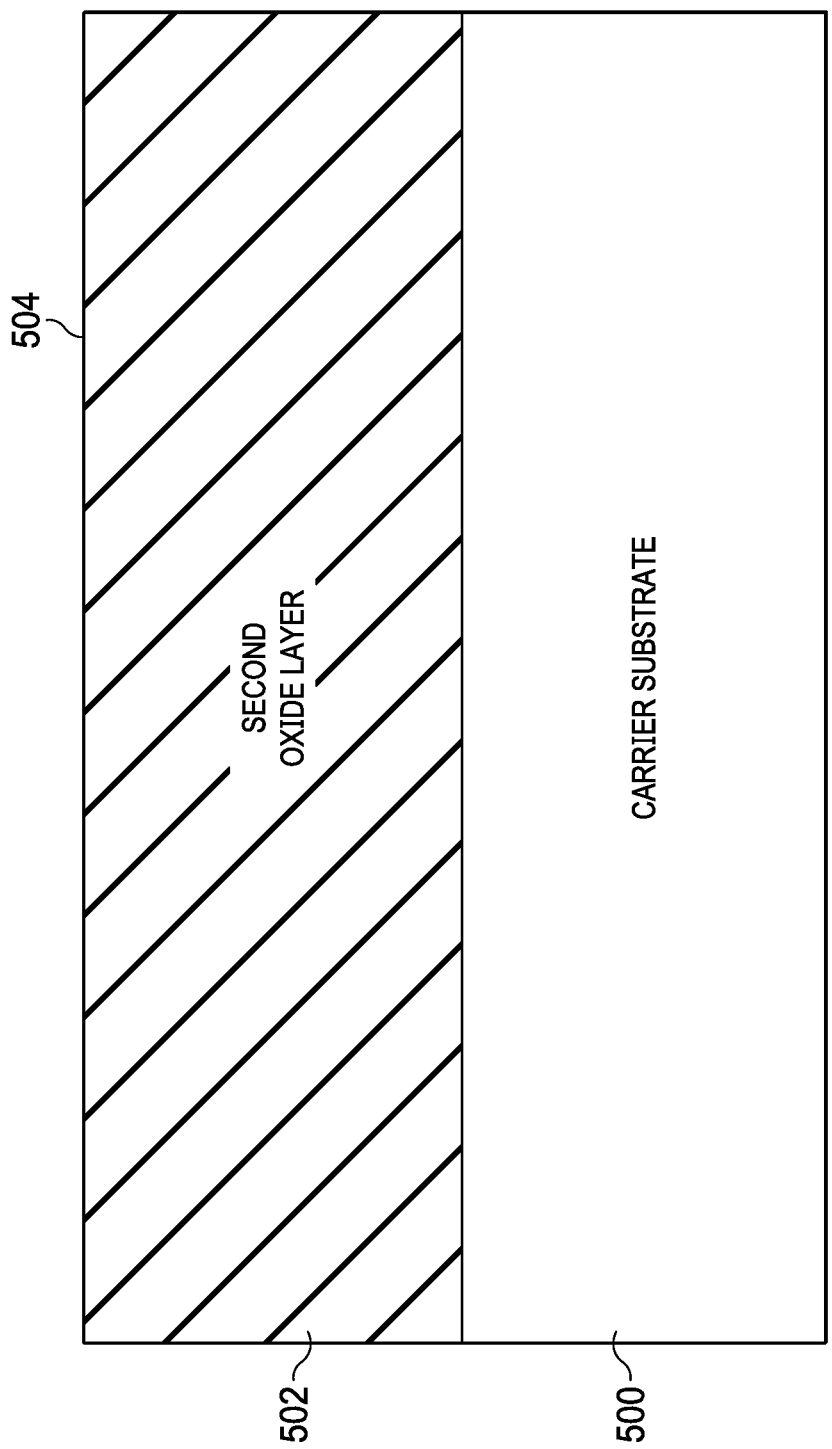
FIG. 5 is an illustration of a cross-sectional view of a carrier substrate in accordance with an illustrative embodiment.

Turning now to FIG. 5, an illustration of a cross-sectional view of a carrier substrate is depicted in accordance with an illustrative embodiment. In this illustrative example, carrier substrate 500 can take a number of different forms. For example, carrier substrate 500 can be one of a silicon carbide substrate, a silicon substrate, an aluminum oxide substrate, a gallium oxide substrate, a silica substrate, an aluminum nitride substrate, a gallium nitride substrate, and other suitable substrates.

As depicted, carrier substrate 500 has second oxide layer 502 with second surface 504. Second oxide layer 502 is comprised of silicon dioxide in this example. Second surface 504 can also be chemical-mechanically polished and treated or activated to be a hydrophilic surface.

In the illustrative example, silicon carbide substrate 100 in FIG. 4 and carrier substrate 500 in FIG. 5 can be bonded to each other. In this illustrative example, carrier substrate 500 is a substrate for the semiconductor structure. On the other hand, silicon carbide substrate 100 includes silicon carbide material that becomes a set of silicon carbide device layers used to form the semiconductor structure.

As depicted, first surface 402 of first oxide layer 400 on bond face 102 on silicon carbide substrate 100 in FIG. 4 can be placed into contact with second surface 504 of second oxide layer 502 in FIG. 5. The bonding by van der Waals forces occurs through contact between first surface 402 of first oxide layer 400 and second surface 504 of second oxide layer 502. These substrates bonded to each other through the oxide layers can be annealed. The annealing can be performed at a temperature of at least 150 degrees C. to strengthen the bond formed between the oxide layers of these two substrates.

Figure 6:
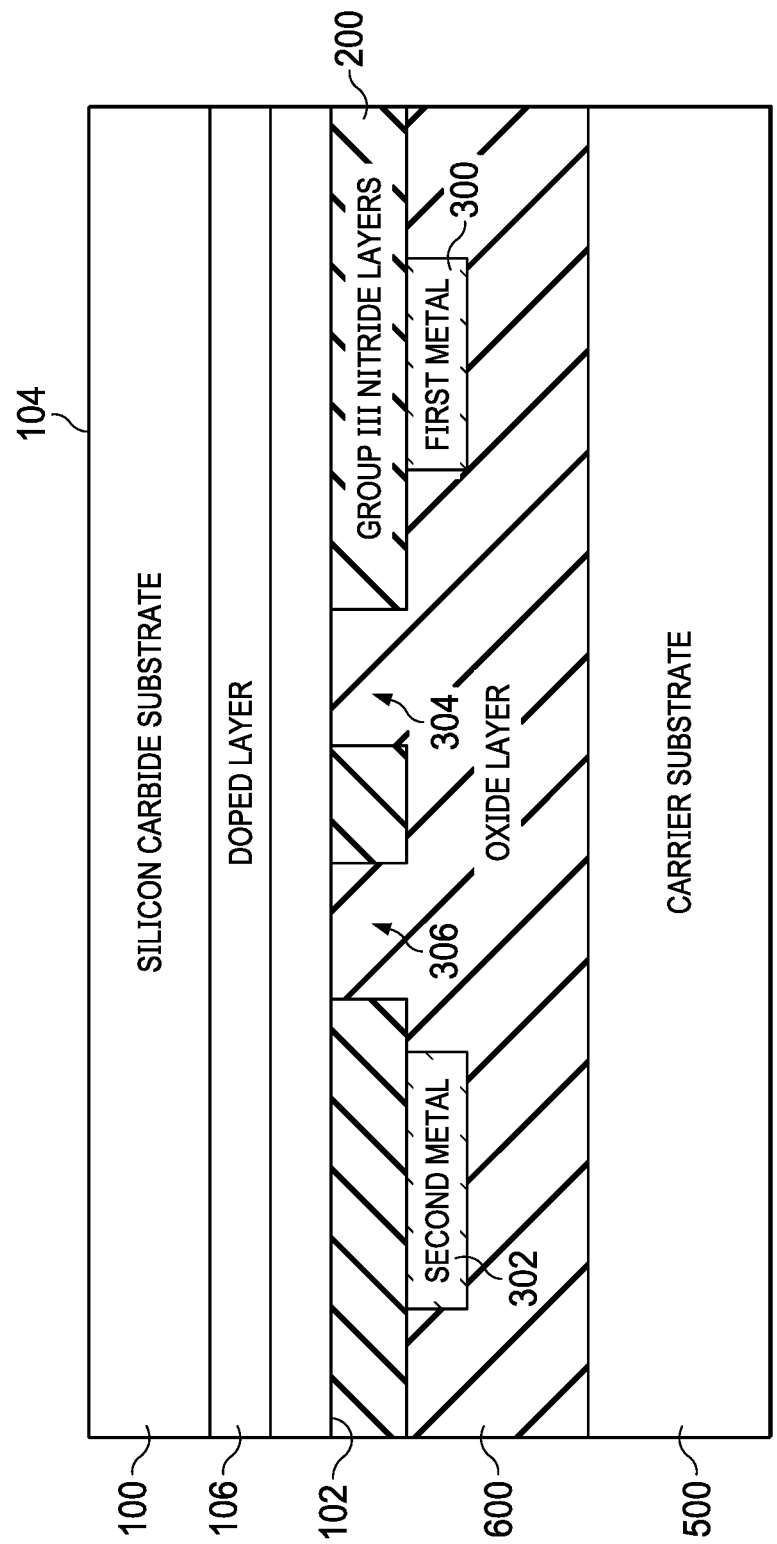
FIG. 6 is an illustration of a cross-sectional view of a silicon carbide substrate bonded to a carrier substrate in accordance with an illustrative embodiment.

With reference now to FIG. 6, an illustration of a cross-sectional view of a silicon carbide substrate bonded to a carrier substrate is depicted in accordance with an illustrative embodiment. In this illustrative example, bonding of silicon carbide substrate 100 and carrier substrate 500 to each other forms oxide layer 600. Carrier substrate 500 is the substrate for the semiconductor structure that is to be formed. Oxide layer 600 is a dielectric layer for the semiconductor structure. In other illustrative examples, other types of dielectrics may be used to form a dielectric layer in addition to or in place of oxide layer 600.

Figure 7:
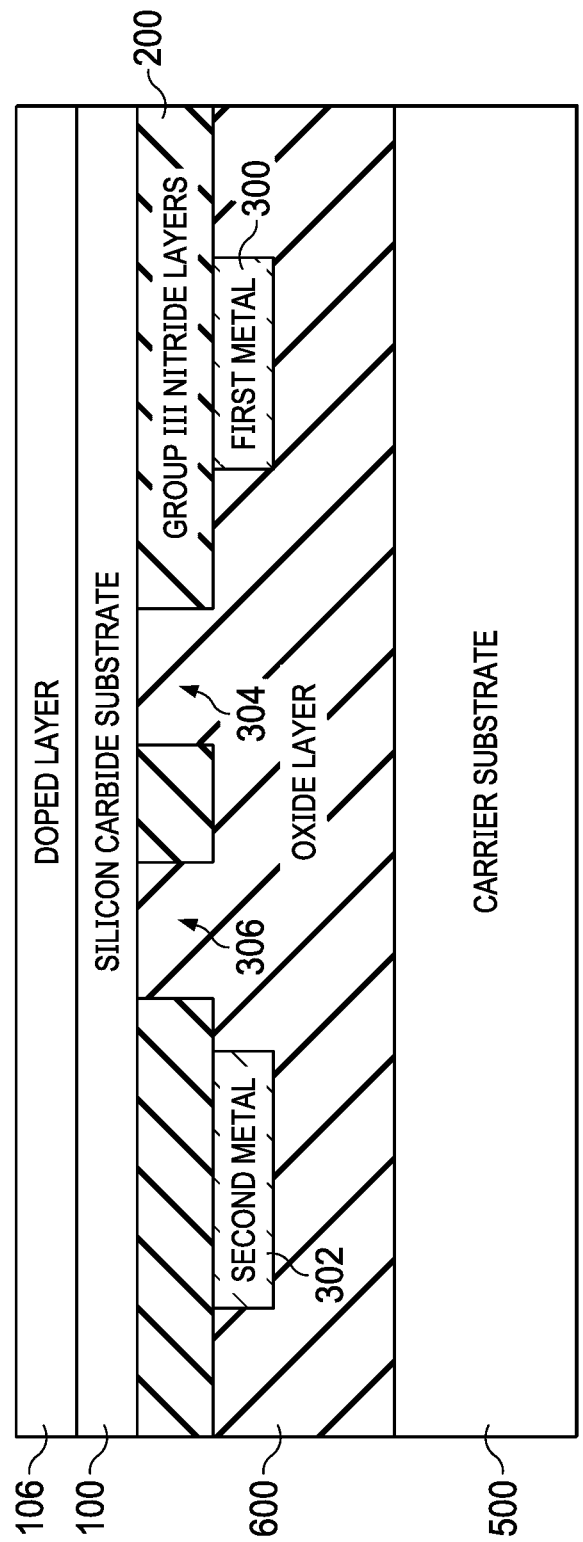
FIG. 7 is an illustration of a cross-sectional view showing removal of a portion of a silicon carbide substrate in accordance with an illustrative embodiment.

With reference now to FIG. 7, an illustration of a cross-sectional view showing removal of a portion of a silicon carbide substrate is depicted in accordance with an illustrative embodiment. As depicted, silicon carbide substrate 100 is thinned. This thinning can occur in stages. For example, silicon carbide substrate 100 can be ground starting from etch face 104 until doped layer 106 in silicon carbide substrate 100 is reached. In this depicted example, the grinding is a mechanical grinding that removes most of silicon carbide substrate 100 down to doped layer 106. In this illustrative example, the grinding can stop at or extend into doped layer 106.

Figure 8:
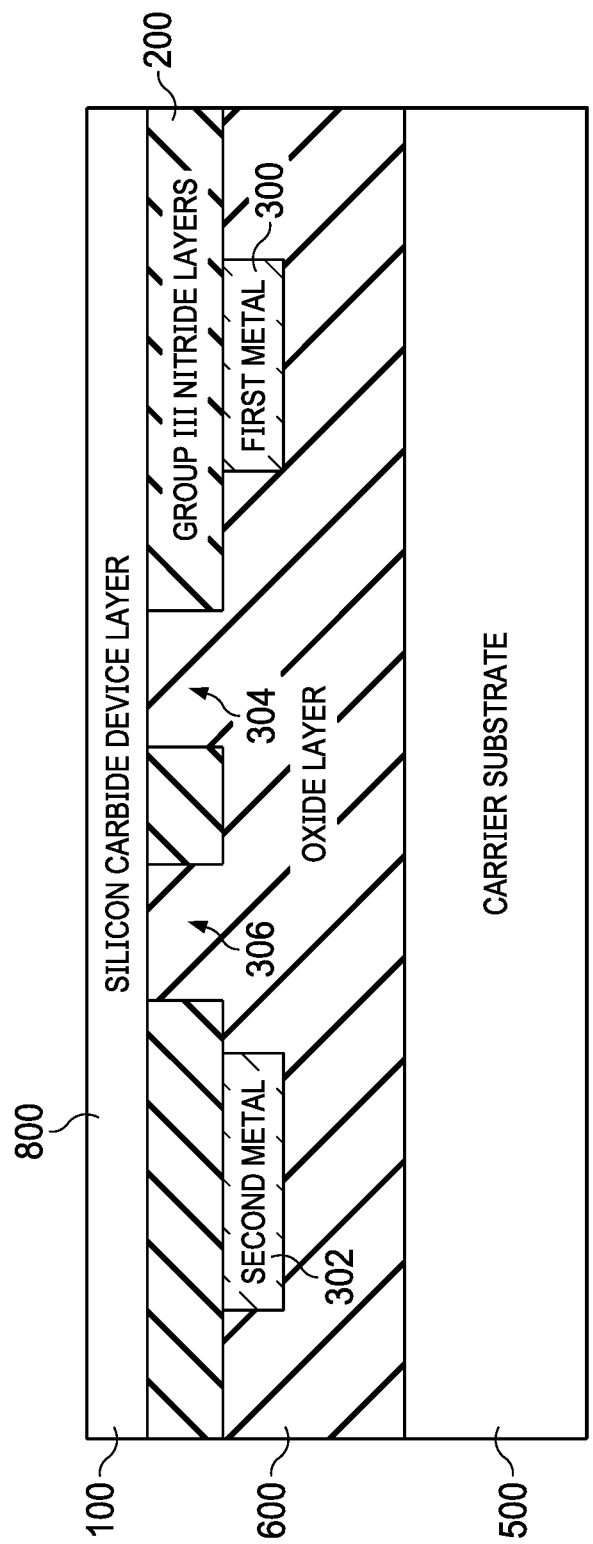
FIG. 8 is an illustration of a cross-sectional view of a silicon carbide device layer in accordance with an illustrative embodiment.

With reference now to FIG. 8, an illustration of a cross-sectional view of a silicon carbide device layer is depicted in accordance with an illustrative embodiment. When doped layer 106 is reached, additional thinning can be performed using a photo-electrochemical (PEC) etching process. As depicted, photo-electrochemical (PEC) etching is performed on the side of silicon carbide substrate 100 that has etch face 104, which is not performed using currently available techniques.

This process can be used to remove doped layer 106. The doping is selected such that other portions of silicon carbide substrate 100 under doped layer 106 are not removed by the photo-electrochemical etching process. Thus, doped layer 106 in silicon carbide substrate 100 functions as a sacrificial layer.

The portion of silicon carbide substrate 100 under doped layer 106 remains as silicon carbide device layer 800. Silicon carbide device layer 800 is an example of a set of silicon carbide layers. In other illustrative examples, multiple silicon carbide layers can be present for use in forming the semiconductor structure. These additional semiconductor carbide layers may have different doping levels that distinguish the layers.

In this illustrative example, silicon carbide device layer 800 is a thin-film layer. In this illustrative example, silicon carbide device layer 800 has a thickness that is from about 10 nanometers to several micrometers. In some illustrative examples, silicon carbide device layer 800 is between about 50 nanometers and about 500 nanometers. Further, processing can be performed to fabricate one or more semiconductor structures using a workpiece comprising silicon carbide device layer 800, a set of group III nitride layers 200, and oxide layer 600 on carrier substrate 500.

With the use of doped layer 106 and the photo-electrochemical etching process, silicon carbide device layer 800 can have a higher level of quality as compared to other currently used techniques. For example, silicon carbide device layer 800 can be a polycrystalline film having a desired uniformity across a wafer. Further, silicon carbide device layer 800 can have reduced inconsistencies or defects that result in reducing undesired optical absorption or scattering. Further, the process in the illustrative example can result in desired epitaxial growth of a desired quality in addition to a desired level of uniformity in film thickness. For example, a thickness variation of less than 50 nm can occur across a 100 mm wafer using the steps in the illustrative example.

The illustrations of the process of forming a semiconductor structure in FIGS. 1-8 are an example of one manner in which an illustrative embodiment can be implemented. The example presented in these figures is not meant to limit the manner in which other illustrative examples can be implemented. For example, in another illustrative example, at least one of the set of group III nitride layers 200, first metal 300, or second metal 302 can be omitted.

Turning next to FIGS. 9-12, illustrations of cross-sections in a process to form a semiconductor structure are depicted in accordance with an illustrative embodiment. With reference first to FIG. 9, an illustration of a cross-sectional view of a substrate is depicted in accordance with an illustrative embodiment. As depicted, silicon carbide substrate 900 is comprised of base substrate 902, doped layer 904, and silicon carbide device layer 906.

As depicted, base substrate 902 is a bulk 4H-SiC wafer that has a wafer normal miscut of 4 degrees or other small angle off-axis from the (0001) crystal direction. Doped layer 904 is a first layer grown as an epitaxial layer of 4H-SiC that is doped and is a sacrificial portion of silicon carbide substrate 900. In this example, 4H-SiC is deposited with the desired specifications of thickness and doping to form silicon carbide device layer 906 in silicon carbide substrate 900.

Further, a set of group III nitride layers, aluminum nitride (AlN) layer 908 and gallium nitride (GaN) layer 910, are grown on silicon carbide device layer 906. In this example, aluminum nitride layer 908 is an undoped AlN buffer layer that is epitaxially grown. Gallium nitride layer 910 can be formed to desired specifications using metal-organic chemical vapor deposition (MOCVD) or molecular beam epitaxy (MBE). The doping of gallium nitride layer 910 can be chosen at the growth stage depending on the application.

As depicted, first oxide layer 912 is deposited on gallium nitride layer 910. In this example, silicon dioxide (SiO2) can be deposited to form first oxide layer 912 using a process such as plasma-enhanced chemical vapor deposition (PECVD), sputtering, or atomic layer deposition. In this illustrative example, the growth of various layers is in the direction of arrow 914. These different layers form workpiece 916.

With reference now to FIG. 10, an illustration of a cross-sectional view for bonding a workpiece to a carrier substrate is depicted in accordance with an illustrative embodiment. As depicted, workpiece 916 is flipped as compared to the view of workpiece 916 in FIG. 9. Workpiece 916 can then be bonded to carrier substrate 1000 which has second oxide layer 1002. In this example, bond face 1001 and etch face 1003 are shown. As depicted, etch face 1003 can be a silicon-face or a carbon-face of silicon carbide substrate 900.

In this illustrative example, carrier substrate 1000 can be silicon carbide, silicon, silica, aluminum oxide, or other suitable materials. As depicted, second oxide layer 1002 is formed using thermal oxidation, plasma enhanced chemical vapor deposition (PEVCD), sputtering, atomic level deposition, or other suitable processes.

In this illustrative example, the bonding can be performed by contact between the oxide layers. The contact is followed by annealing at a temperature of about 200 degrees C. in this example.

Figure 11:
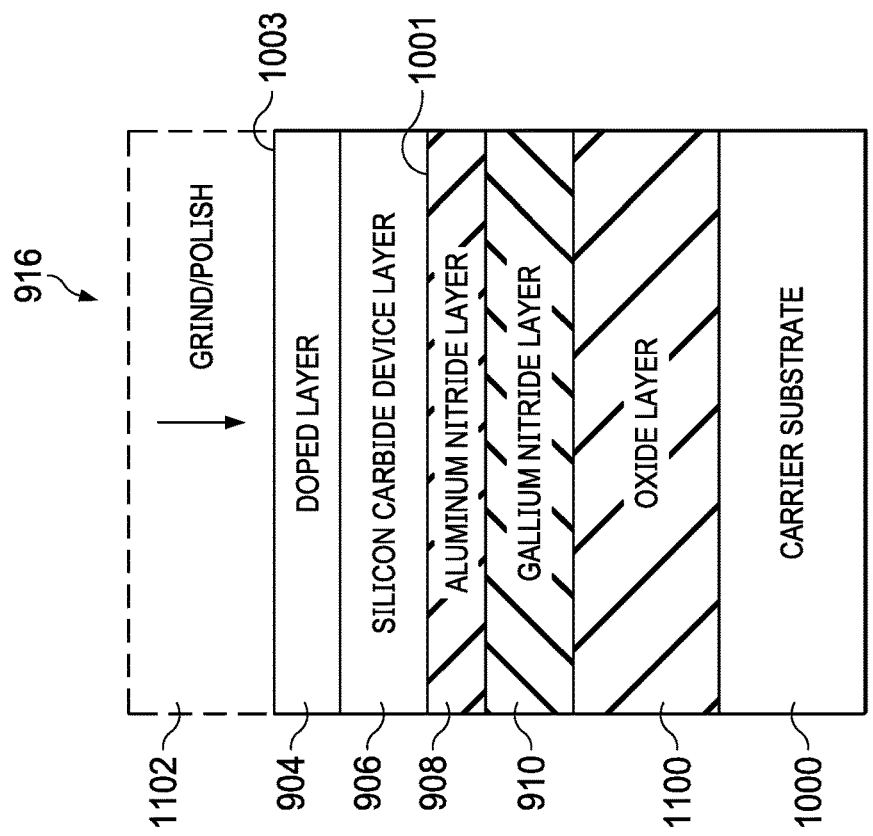
FIG. 11 is an illustration of a cross-sectional view showing removal of a silicon carbide material from a silicon carbide substrate in accordance with an illustrative embodiment.

In FIG. 11, an illustration of a cross-sectional view of removal of a silicon carbide material from a silicon carbide substrate is depicted in accordance with an illustrative embodiment. In this figure, bonding of first oxide layer 912 and second oxide layer 1002 to each other forms oxide layer 1100.

As depicted, silicon carbide substrate 900 is thinned by mechanical grinding and can be polished with chemical-mechanical polishing (CMP) as shown by section 1102. Section 1102 indicates the silicon carbide material that has been removed. As shown, in this example, the removal extends into doped layer 904.

In this example, mechanical polishing is used to remove a portion and not all of doped layer 904. Mechanical grinding and polishing may be suitable in some cases such as over length scales from micrometers to millimeters. However, as larger length scales are present and thin-film thicknesses are desired across the entire wafer, and moreover the forces and stresses with this type of removal of material may introduce undesired inconsistencies such as lattice defects, dislocations, and crystal strain.

In this illustrative example, the mechanical grinding is stopped when the grinding extends into doped layer 904. For example, the mechanical grinding can stop when doped layer 904 is still about a few micrometers thick.

Figure 12:
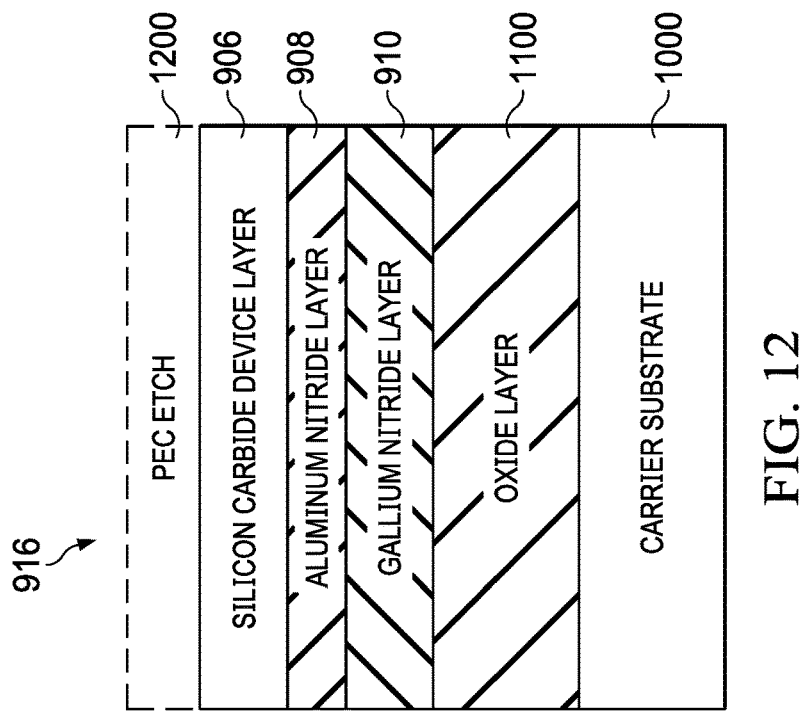
FIG. 12 is an illustration of a cross-sectional view of a silicon carbide material etched to reach a silicon carbide device layer in accordance with an illustrative embodiment.

Turning to FIG. 12, an illustration of a cross-sectional view of a silicon carbide material etched to reach a silicon carbide device layer is depicted in accordance with an illustrative embodiment. As depicted, in this cross-sectional view, a photo-electrochemical etching process is used to remove the remaining portion of doped layer 904 as shown in section 1200. This etching exposes silicon carbide device layer 906 without removing material from silicon carbide device layer 906. The dopant and doping level in doped layer 904 are selected such that doped layer 904 can be etched without removing material from silicon carbide device layer 906.

With photo-electrochemical etching, dopant type selected etching can be performed in which doped layer 904 is removed to expose silicon carbide device layer 906. In this illustrative example, silicon carbide device layer 906 can have desired properties such as a clean crystalline surface with a lower level of defect density as compared to using mechanical grinding.

In this illustrative example, the photo-electrochemical etching process can be performed while doped layer 904 is in contact with a solution such as a diluted potassium hydroxide or hydrofluoric acid and water.

Further, illumination of carrier substrate 1000 with the different layers can be performed using the illumination with a wavelength of light corresponding to a photon energy that is above the bandgap of silicon carbide. In this depicted example, a light source contains wavelengths shorter than 390 nm for 4H-SiC due to its bandgap of about 3.2 eV. A voltage bias can be applied between a contact on one of the sample's doped layers and a platinum electrode in the aqueous solution. The etch selectivity of p-type, n-type, and intrinsic material can be adjusted and optimized by controlling the direct current voltage bias magnitude and direction. Since the photo-electrochemical etching involves wet chemistry and is selective depending on the doping-type, the final result of thin-films of silicon carbide and group III nitrides have a desired level of uniformity and planarity across the wafer. This result is in contrast to currently available techniques such as smart-cut, which uses ion implantation to create an amorphous layer at a defined depth. The photo-electrochemical etching in the illustrative example avoids introducing new point defects or dopants into the silicon carbide and group III nitride thin-films.

Figures 13, 14:
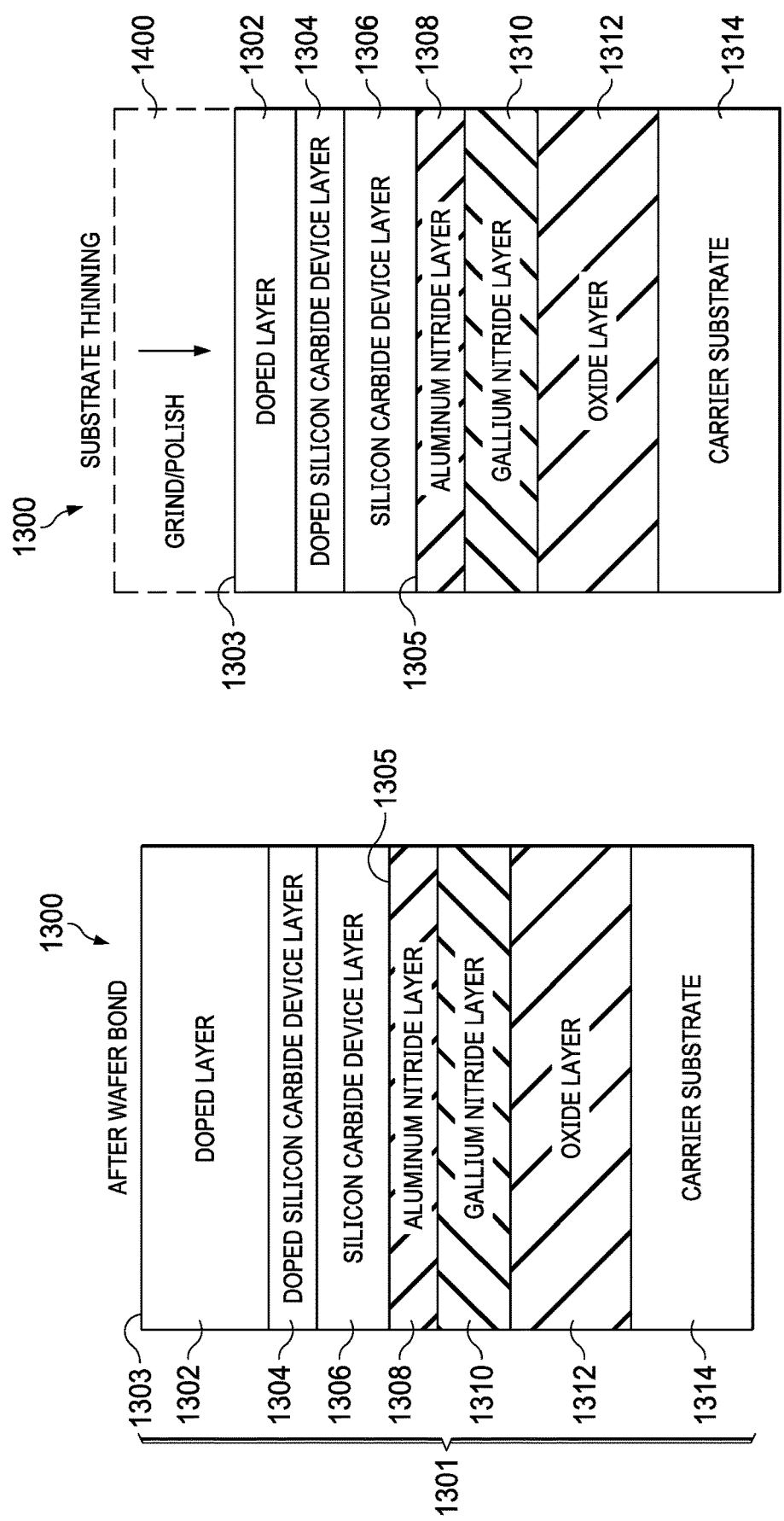
FIG. 13 is an illustration of a cross-sectional view of a workpiece in accordance with an illustrative embodiment.
FIG. 14 is an illustration of a cross-sectional view of removal of a silicon carbide material in accordance with an illustrative embodiment.
Figure 15:
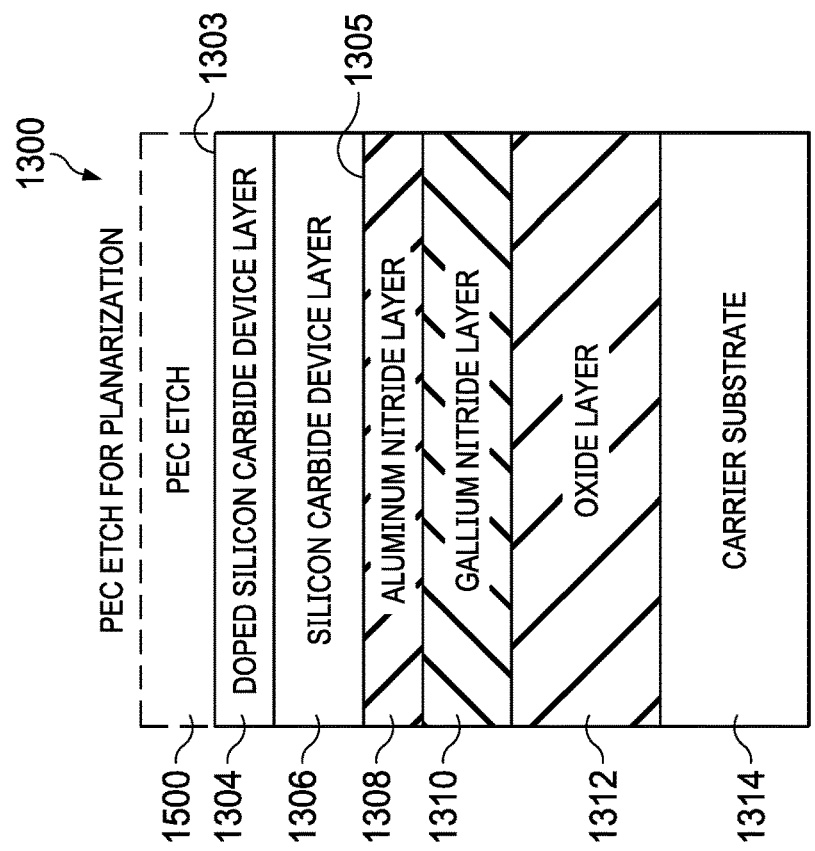
FIG. 15 is an illustration of a cross-sectional view of a doped layer in reach of a silicon carbide device layer in accordance with an illustrative embodiment.

Next, FIGS. 13-15 are cross-sectional views of a workpiece etched using photo-electrochemical etching in accordance with an illustrative embodiment. With reference to FIG. 13, an illustration of a cross-sectional view of a workpiece is depicted in accordance with an illustrative embodiment. As depicted, workpiece 1300 is a result of bonding a silicon carbide substrate to a carrier substrate in which a bond is formed between oxide layers on the two substrates.

In this illustrative example, workpiece 1300 comprises silicon substrate 1301, which includes doped layer 1302, doped silicon carbide device layer 1304, silicon carbide device layer 1306, aluminum nitride (AlN) layer 1308, gallium nitride (GaN) layer 1310, oxide layer 1312, and carrier substrate 1314. In this example, doped layer 1302 is a top layer and not located in other layers in silicon substrate 1301 as depicted in other prior examples. Workpiece 1300 has bond face 1305 and etch face 1303. As depicted, etch face 1303 can be a silicon-face or a carbon-face.

As depicted, doped layer 1302 is an n-type layer. In other illustrative examples, doped layer 1302 can be a p-type layer. The doping differentials are selected to avoid etching of doped silicon carbide device layer 1304. In other words, the doping level and doping type can be selected for doped silicon carbide device layer 1304 such that this layer functions as an etch-stop for the photo-electrochemical etching process.

In this depicted example, doped layer 1302 is a sacrificial layer that can be etched using a photo-electrochemical etching process. The doping level of doped layer 1302 is of a sufficiently different doping type, density, or both from doped silicon carbide device layer 1304, which has a doping type and level to define an etch-stop. In this example, the etch selectivity can be maximized when doped layer 1302 is doped with a concentration that is greater than $1 \times 10^{18}$ cm$^{-3}$, and doped silicon carbide device layer 1304 has a doping concentration of at least $1 \times 10^{18}$ cm$^{-3}$ and an opposite dopant type to that of doped layer 1302.

In this illustrative example, the type of dopant for doped layer 1302 is an n-type while the type of dopant for doped silicon carbide device layer 1304 is a p-type. If a different type of dopant is desired for doped silicon carbide device layer 1304, such as a p-type dopant, then the type of dopant used in doped layer 1302 can be changed to an n-type dopant.

In another illustrative example, the sacrificial layer, doped layer 1302, and the etch-stop layer, doped silicon carbide device layer 1304, are doped to a concentration of about $1 \times 10^{17}$ cm$^{-3}$ concentration or greater. At doping levels of $1 \times 10^{17}$ cm$^{-3}$ and above, the etch rate of silicon carbide can depend on voltage bias present during the photo-electrochemical etching. The etch rate begins to vary more heavily with the doping concentration and is a factor that gives photo-electrochemical etching selectivity based on doping type. Further, doped silicon carbide device layer 1304 can be, for example, about 100 nanometers or thicker. Silicon device layers below doped silicon carbide device layer 1304 can be any desired thickness formed from growth. For example, the thickness of these layers can be from about 50 nanometers to 200 microns thick with customizable doping concentrations. Nitride layers, such as a AlN layer and a GaN layer, can each have a thicknesses suitable for particular semiconductor devices.

In this illustrative example, a voltage bias can be applied through ohmic contacts to the surface of doped layer 1302. Further, the surface of the silicon carbide layer is in contact with an aqueous potassium hydroxide solution and is exposed to light that is above bandgap energy. The light can have wavelengths shorter than 390 nanometers in this example.

Turning to FIG. 14, an illustration of a cross-sectional view of removal of a silicon carbide material is depicted in accordance with an illustrative embodiment. In this illustrative example, substrate thinning is performed by grinding and polishing to remove silicon carbide material from doped layer 1302 as seen by section 1400 that represents the removed silicon carbide material. This polishing can be mechanical polishing, chemical-mechanical polishing, or a combination of the two. As can be seen in this example, a portion of doped layer 1302 remains after the grinding and chemical mechanical polishing.

In FIG. 15, an illustration of a cross-sectional view of a doped layer in reach of a silicon carbide device layer is depicted in accordance with an illustrative embodiment. In this illustrative example, doped layer 1302 is etched using a photo-electrochemical etching process to reach doped silicon carbide device layer 1304, which is an etch-stop layer in this example. Section 1500 shows the removed silicon carbide material.

Thus, the processes illustrated in FIGS. 1-15 enable forming silicon carbide layers for use in devices with desired properties. For example, silicon carbide device layers can be formed on a scale of the size of a wafer to have a desired level of uniformity in the thickness of the layer. Additionally, the silicon carbide device layers can be formed with reduced levels of material damage such that undesired optical absorption or scattering can be avoided. With these processes, desired quality for the silicon carbide layers using devices can be obtained on larger sizes such as a wafer as compared to current techniques.

Figure 16:
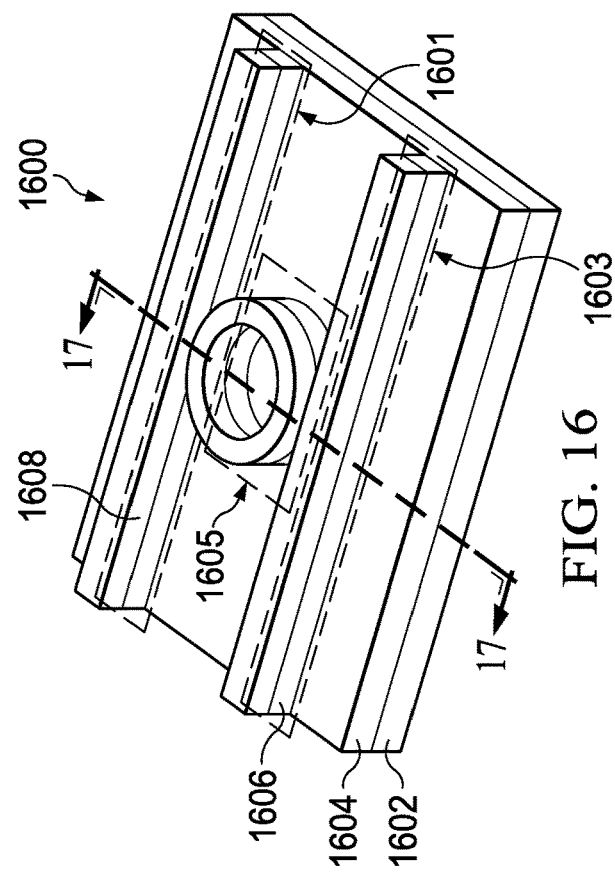
FIG. 16 is an illustration of a waveguide coupled optical resonator and filter in accordance with an illustrative example.

Turning next to FIG. 16, an illustration of a waveguide coupled optical resonator and filter is depicted in accordance with an illustrative example. As depicted, waveguide coupled optical resonator and filter 1600 is a semiconductor device formed on carrier substrate 1602 having oxide layer 1604, aluminum nitride layer 1606, and silicon carbide layer 1608. Carrier substrate 1602 with oxide layer 1604, aluminum nitride layer 1606, and silicon carbide layer 1608 can be formed using the processes illustrated in FIG. 1-8, FIGS. 9-12, and FIGS. 13-15.

In this illustrative example, aluminum nitride layer 1606 is in direct contact with silicon carbide layer 1608. In other examples, one or more other layers can be located between aluminum nitride layer 1606 and silicon carbide layer 1608.

In this example, waveguide coupled optical resonator and filter 1600 has three components. As depicted, waveguide coupled optical resonator and filter 1600 is comprised of linear waveguide 1601, linear waveguide 1603, and ring waveguide 1605. In this example, waveguide coupled optical resonator and filter 1600 can filter selected wavelengths of light. For example, light traveling through linear waveguide 1601 can be passed into ring waveguide 1605. Ring waveguide 1605 can pass a selected wavelength or selected wavelengths of light to linear waveguide 1603, acting as a filter as to what light is passed from linear waveguide 1601 to linear waveguide 1603.

Figure 17:
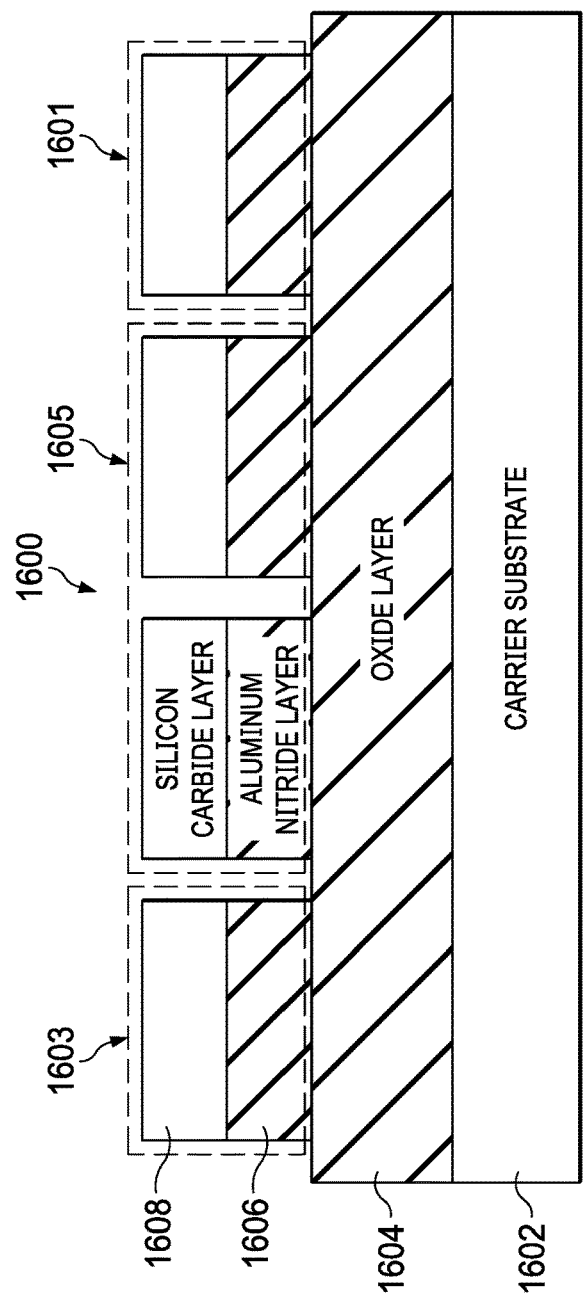
FIG. 17 is an illustration of a cross-sectional view of a waveguide coupled optical resonator and filter in accordance with an illustrative embodiment.

With reference to FIG. 17, an illustration of a cross-sectional view of a waveguide coupled optical resonator and filter is depicted in accordance with an illustrative embodiment. In this figure, a cross-sectional view of waveguide coupled optical resonator and filter 1600 is shown taken along line 17-17 in FIG. 16. In this example, oxide layers are bonded to form oxide layer 1604. Thereafter, aluminum nitride layer 1606 and silicon carbide layer 1608 can be etched to form the structures that form linear waveguide 1601, linear waveguide 1603, and ring waveguide 1605.

Figure 18:
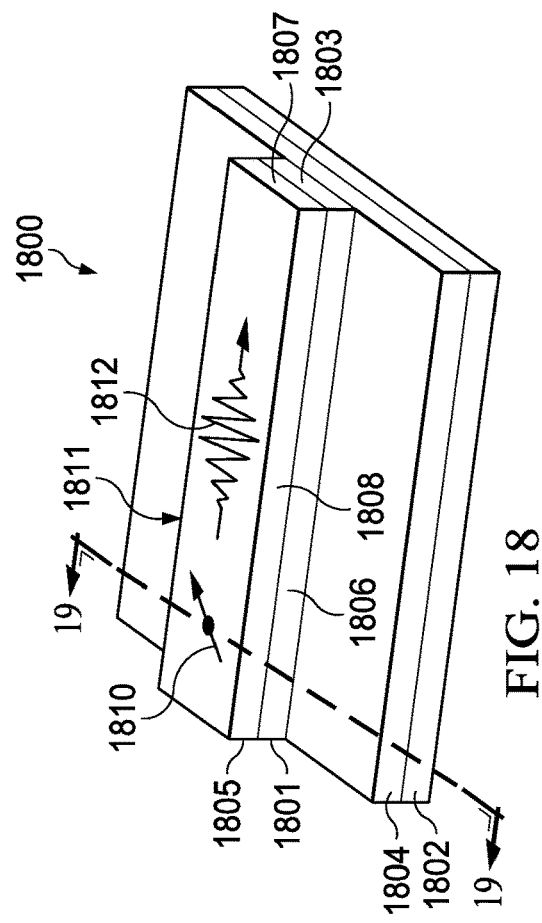
FIG. 18 is an illustration of an integrated optical waveguide containing a quantum memory in accordance with an illustrative example.

With reference to FIG. 18, an illustration of an integrated optical waveguide containing a quantum memory is depicted in accordance with an illustrative example. As depicted, quantum memory device 1800 is a semiconductor device formed on carrier substrate 1802 having oxide layer 1804, aluminum nitride region 1806, and silicon carbide region 1808. In this example, carrier substrate 1802 with oxide layer 1804, aluminum nitride region 1806, and silicon carbide region 1808 can be formed using the processes illustrated in FIG. 1-8, FIGS. 9-12, and FIGS. 13-15.

As depicted, aluminum nitride region 1806 has side 1801 and side 1803. Silicon carbide region 1808 has side 1805 and side 1807.

In this example, quantum memory device 1800 includes quantum memory 1810 and integrated optical waveguide 1811. Quantum memory 1810 is coupled to integrated optical waveguide 1811. Quantum memory 1810 can be formed from a defect in the silicon carbide material in silicon carbide region 1808. The defect can be, for example, a point defect selected from a divacancy, a silicon monovacancy, other vacancy complex, a transition metal ion, or a rare earth ion in silicon carbide region 1808. Quantum memory 1810 can emit photon 1812 depending on the electron spin associated with that defect or color center, and the state of the photon can be entangled to the electron spin state. Photon 1812 emitted from quantum memory 1810 can travel into integrated optical waveguide 1811.

Figure 19:
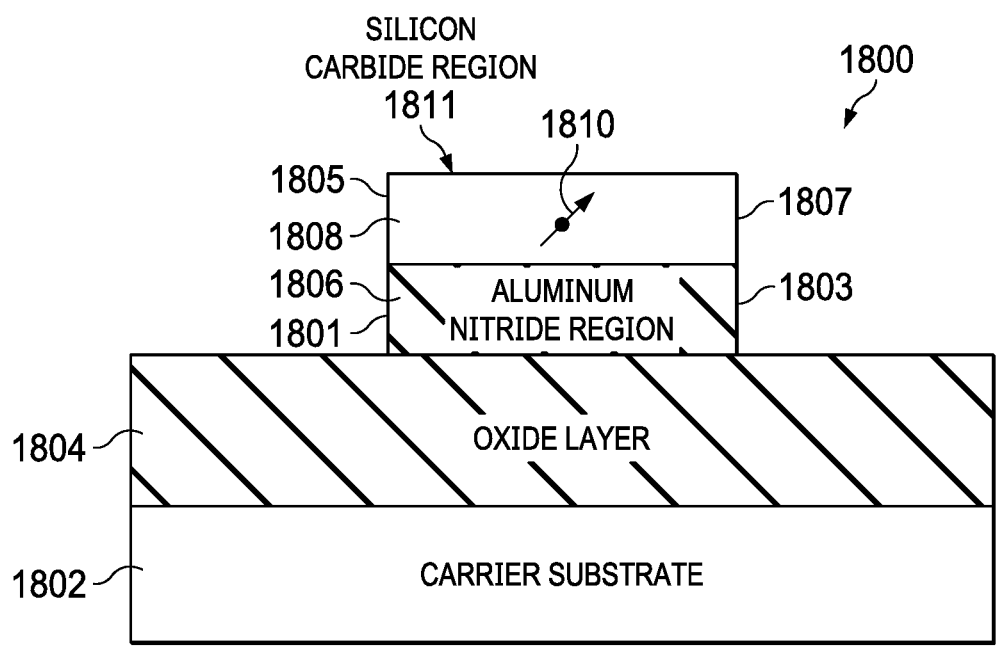
FIG. 19 is an illustration of a cross-sectional view of an integrated optical waveguide containing a waveguide coupled quantum memory in accordance with an illustrative embodiment.

With reference to FIG. 19, an illustration of a cross-sectional view of an integrated optical waveguide containing a quantum memory is depicted in accordance with an illustrative embodiment. In this figure, a cross-sectional view of quantum memory device 1800 is shown taken along line 19-19 in FIG. 18.

Turning to FIGS. 20-23, illustrations of waveguide structures fabricated are depicted in accordance with one or more illustrative embodiments. These depicted waveguide structures can be formed using the processes illustrated in FIG. 1-8, FIGS. 9-12, and FIGS. 13-15. These waveguides also could be used instead of the optical wave-guiding structures depicted in FIGS. 16 and 18 and whose cross-sections are illustrated in FIGS. 17 and 19.

Figure 20:
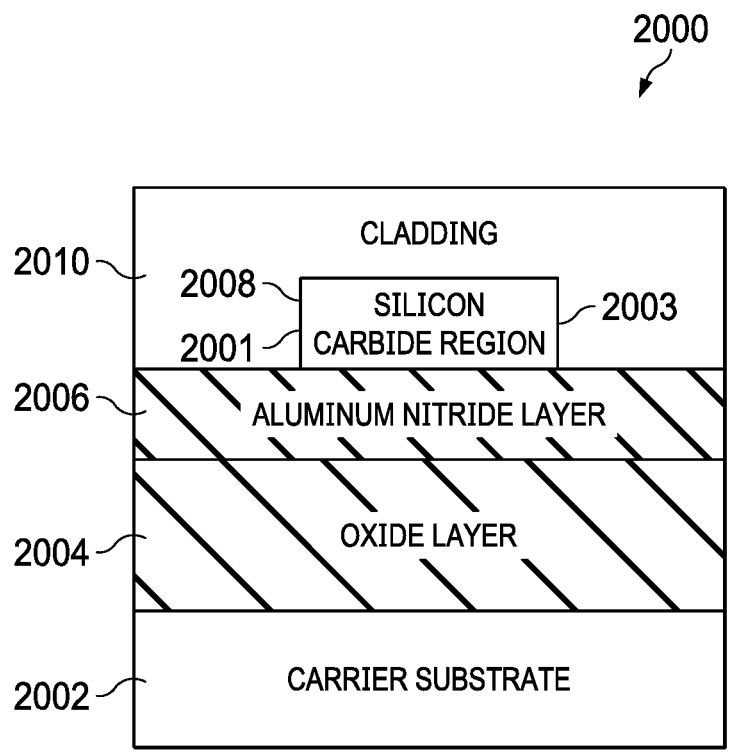
FIG. 20 is a cross-sectional view of a waveguide in accordance with an illustrative embodiment.

With reference to FIG. 20, a cross-sectional view of a waveguide is depicted in accordance with an illustrative embodiment. As illustrated, waveguide 2000 is an example of a strip waveguide that can be formed in the illustrative examples.

In this depicted example, waveguide 2000 is formed on carrier substrate 2002. Oxide layer 2004 is located on carrier substrate 2002. Aluminum nitride layer 2006 is on oxide layer 2004, and silicon carbide region 2008 is located on aluminum nitride layer 2006. As shown in this figure, silicon carbide region 2008 has been patterned and etched to form waveguide 2000.

As used herein, a region is a layer that does not extend without limit. A region has defined sides in this example. As depicted, silicon carbide region 2008 has side 2001 and side 2003.

Cladding 2010 covers silicon carbide region 2008 and aluminum nitride layer 2006. In this example, cladding 2010 is in direct contact with silicon carbide region 2008 and aluminum nitride layer 2006. Cladding 2010 can be comprised of a material selected from at least one of an air, a vacuum, a resist, a polymer, a silicon nitride, a silicon dioxide, or some other material. In other words, cladding 2010 can be comprised of more than one type of material in some illustrative examples. In this example, cladding 2010 has a lower refractive index than the refractive index for silicon carbide region 2008.

In this illustrative example, carrier substrate 2002 has a thickness that is from about 100 μm. Oxide layer 2004 has a thickness of about 3.0 μm in this example. Aluminum nitride layer 2006 has a thickness of about 200 nm, and silicon carbide region 2008 has a thickness of about 300 nm and a width of about 1.0 μm. Cladding 2010 has a thickness of about 500 nm to about 5.0 μm.

In this illustrative example, a silicon carbide layer can be etched to form silicon carbide region 2008 while aluminum nitride layer 2006 is not etched. This etching can be performed after bonding.

The cross-section of the structure depicted for waveguide 2000 in FIG. 20 can be used to form components for a semiconductor structure. For example, silicon carbide region 2008 can be duplicated to form four regions. The two outer regions can each be part of a linear waveguide and the two inner regions can be for a ring waveguide.

Figure 21:
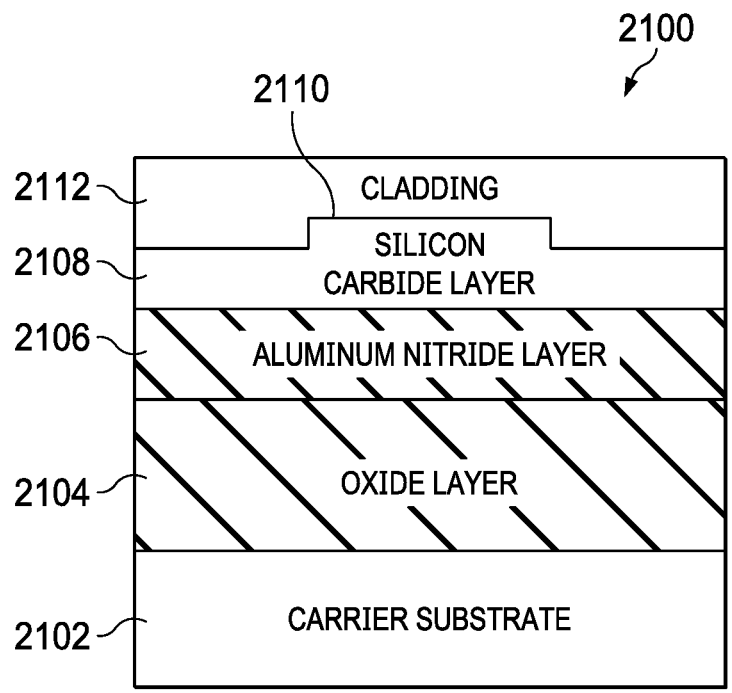
FIG. 21 is another cross-sectional view of a waveguide in accordance with an illustrative embodiment.

Turning next to FIG. 21, another cross-sectional view of a waveguide is depicted in accordance with an illustrative embodiment. As depicted, waveguide 2100 is an example of a rib waveguide that can be formed in the illustrative examples.

In this illustrative example, waveguide 2100 is formed on carrier substrate 2102. Oxide layer 2104 is located on carrier substrate 2102. Aluminum nitride layer 2106 is on oxide layer 2104, and silicon carbide layer 2108 is located on aluminum nitride layer 2106. Further, rib region 2110 is a region of silicon carbide that extends from silicon carbide layer 2108. As shown in this figure, silicon carbide layer 2108 has been patterned and etched to form waveguide 2100 in the form of a rib waveguide having rib region 2110.

Waveguide 2100 also has cladding 2112 that covers silicon carbide layer 2108 and rib region 2110. In this example, cladding 2112 is in direct contact with these components. Cladding 2112 has a refractive index that is lower than silicon carbide layer 2108 and rib region 2110.

In this illustrative example, carrier substrate 2102 has a thickness that is from about 100 µm. Oxide layer 2004 has a thickness of about 3.0 µm in this example.

Aluminum nitride layer 2106 has a thickness of about 200 nm. Silicon carbide layer 2108 has a thickness of about 100 nm. Rib region 2110 extending from silicon carbide layer 2008 has a thickness of about 200 nm and a width of about 1.0 µm. Cladding 2112 has a thickness of about 500 nm to about 5.0 µm.

Figure 22:
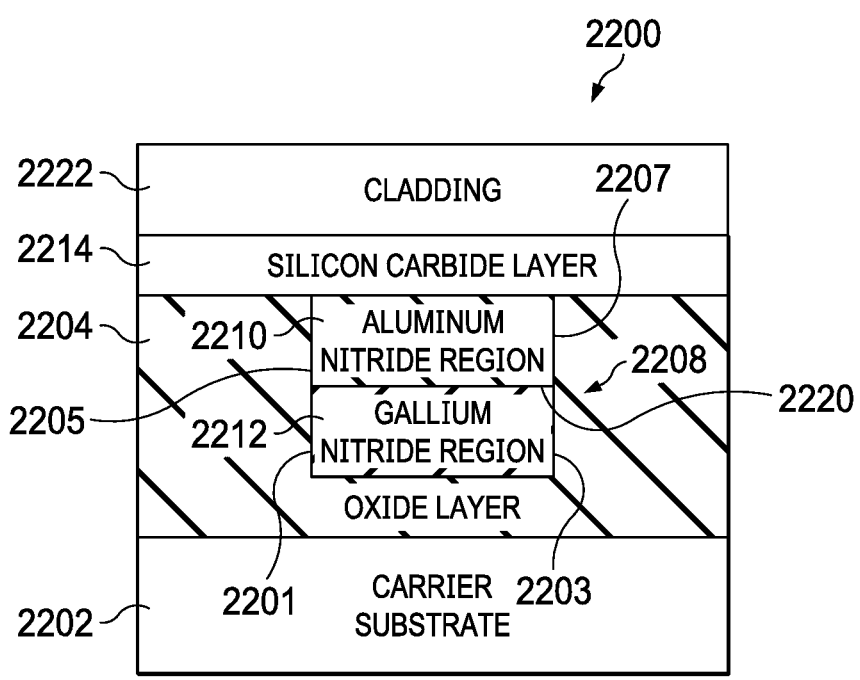
FIG. 22 is yet another cross-sectional view of waveguide in accordance with an illustrative embodiment.

In FIG. 22, yet another cross-sectional view of a waveguide is depicted in accordance with an illustrative embodiment. As illustrated, waveguide 2200 is an example of a buried ridge waveguide structure.

In this depicted example, waveguide 2200 is formed on carrier substrate 2202. Oxide layer 2204 is located on carrier substrate 2202. Gallium nitride region 2212 is located on oxide layer 2204 in cavity 2208 in oxide layer 2204. Aluminum nitride region 2210 is located on gallium nitride region 2212 in cavity 2208 in oxide layer 2204. Aluminum nitride region 2210 and gallium nitride region 2212 are an example of a set of group III nitride regions that may be buried in cavity 2208.

Regions are layers that have defined sides and can be located within another material. In this example, gallium nitride region 2212 has side 2201 and side 2203 in cavity 2208 in oxide layer 2204. Aluminum nitride region 2210 has side 2205 and side 2207 in cavity 2208 in oxide layer 2204.

In this example, silicon carbide layer 2214 is located on oxide layer 2204 and aluminum nitride region 2210. As shown in this figure, silicon carbide layer 2214, aluminum nitride region 2210, and gallium nitride region 2212 in cavity 2208 of oxide layer 2204 form waveguide 2200. Aluminum nitride region 2210 and gallium nitride region 2212 form ridge 2220 buried in oxide layer 2204. The refractive index of at least one of aluminum nitride region 2210 or gallium nitride region 2212 is higher than the refractive index of oxide layer 2204.

As depicted, waveguide 2200 has cladding 2222 that covers silicon carbide layer 2214. In this illustrative example, cladding 2222 is in direct contact with silicon carbide layer 2214. Cladding 2222 has a refractive index that is lower than the refractive index of silicon carbide layer 2214.

In this illustrative example, carrier substrate 2202 has a thickness about 100 µm. Oxide layer 2204 has a thickness of about 3.3 µm in this example. Aluminum nitride layer 2210 has a thickness of about 100 nm, and gallium nitride layer 2212 has a thickness of about 200 nm. These two layers in cavity 2208 have a width of about 1.0 µm. As depicted, silicon carbide layer 2214 has a thickness of about 200 nm. Cladding 2222 has a thickness of about 500 nm to about 5.0 µm.

In this example, an aluminum nitride layer and a gallium nitride region are etched to form aluminum nitride region 2210 and gallium nitride region 2212. A first oxide layer is formed to bury aluminum nitride region 2210 and gallium nitride region 2212. This first oxide layer is then bonded to a second oxide layer on carrier substrate 2202. The first oxide layer and the second oxide layer can then be bonded to form oxide layer 2204.

In this illustrative example, the semiconductor structure depicted in FIG. 22 can be fabricated using operations depicted in the illustrative examples. For example, group III nitride layers can be patterned and etched before depositing oxide and wafer bonding. The waveguide structures can be integrated with lateral (horizontal) diodes and doping for active electronics and depletion layers in silicon carbide layer 2214. The doped regions could be fabricated either by masked implantation followed by annealing, or substrate (SiC and GaN) doping during growth followed by patterning and etching, or a combination thereof. Applying electric fields in these materials across p-n junctions or between metal contacts could be used to tune the resonance frequency of an optical resonator or optical emission frequency of embedded single photon emitters.

Figure 23:
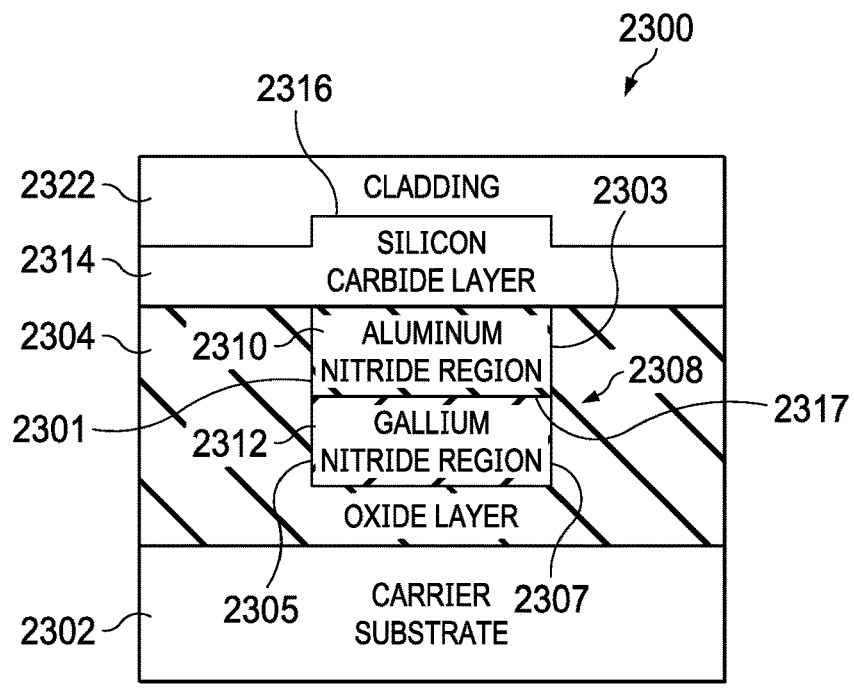
FIG. 23 is still another cross-sectional view of a waveguide in accordance with an illustrative embodiment.

With reference now to FIG. 23, still another cross-sectional view of a waveguide is depicted in accordance with an illustrative embodiment. As illustrated, waveguide 2300 is another example of a buried optical waveguide structure.

In this depicted example, waveguide 2300 is formed on carrier substrate 2302. Oxide layer 2304 is located on carrier substrate 2302. Gallium nitride region 2312 is located on oxide layer 2304 in cavity 2308 in oxide layer 2304. Aluminum nitride region 2310 is located on gallium nitride region 2312 in cavity 2308 in oxide layer 2304. Aluminum nitride region 2310 has side 2301 and side 2303. Gallium nitride region 2312 has side 2305 and side 2307. As depicted, aluminum nitride region 2310 and gallium nitride region 2312 form ridge 2317 that is buried in cavity 2308 in oxide layer 2304.

In this example, silicon carbide layer 2314 is located on oxide layer 2304 and aluminum nitride region 2310. Further, rib region 2316 extends from silicon carbide layer 2314. As shown in this figure, rib region 2316 is a portion of silicon carbide that extends from silicon carbide layer 2314 and can be referred to as a silicon carbide region. As depicted, silicon carbide layer 2314, rib region 2316, aluminum nitride region 2310, and gallium nitride region 2312 in cavity 2308 of oxide layer 2304 form waveguide 2300.

As depicted, waveguide 2300 has cladding 2322 that covers silicon carbide layer 2314 and rib region 2316. As depicted, cladding 2222 is in direct contact with silicon carbide layer 2214 and rib region 2316. Cladding 2222 has a refractive index that is lower than silicon carbide layer 2214 and rib region 2316.

In this illustrative example, carrier substrate 2302 has a thickness that is from about 100 µm. Oxide layer 2304 has a thickness of about 3.3 µm in this example. Aluminum nitride region 2310 has a thickness of about 100 nm, and gallium nitride region 2312 has a thickness of about 200 nm. These two regions in cavity 2308 have a width of about 1.0 µm. As depicted, silicon carbide layer 2214 has a thickness of about 100 nm. Rib region 2316 has a width of about 1.0 µm and a thickness of about 200 nm. Cladding 2322 has a thickness of about 500 nm to about 5.0 µm.

The illustrations of waveguide structures in FIGS. 20-23 are provided as an example of one type of semiconductor structure that can be fabricated in accordance with one or more illustrative examples. These illustrations are not meant to limit the manner in which other illustrative examples can be implemented.

For example, the thicknesses illustrated for these layers and regions are examples of thicknesses that can be used for thin-film implementations. These thicknesses are not meant to limit the thicknesses that can be used in other illustrative examples.

Further, the number and types of group III nitride layers and regions can vary from those illustrated in FIGS. 20-23. For example, an indium nitride (InN) layer and an indium aluminum gallium nitride (InAlGaN) layer can be used in addition to or in place of the aluminum nitride (AlN) and gallium nitride (GaN) layers depicted.

As another example, other types of semiconductor structures can be fabricated in addition to or in place of waveguide structures. For example, a semiconductor structure can include at least one of a superconducting single photon detector, an optical emitter, a quantum memory using a point defect within the silicon carbide device layer, or other suitable types of components in the semiconductor structure.

Additional examples of semiconductor structures with one or more silicon carbide device layers and one or more group III nitride layers that can be fabricated using operations in one or more illustrative examples comprise microelectromechanical systems and photonic components including waveguide-coupled four-port and two-port ring resonators or filters. In still other illustrative examples, superconducting materials can be deposited in a manner that allows for the operation of superconducting nanowire single photon detectors and logical components at cryogenic temperatures alongside the photonic, electrical, and mechanical components.

As another example, with slot waveguides, the optical mode can be selected for a lower refractive index cladding or vacuum outside the substrate by etching two ridges closely spaced together. The spacing can be, for example, less than a few hundred nanometers. As another example, suspended waveguides can be fabricated from similar material stacks as those depicted in these figures by lithographically patterning and then chemically etching away oxide (SiO2) in selective areas, which would yield an optical spatial mode that extends more into air or vacuum instead of into the oxide layer.

Figure 24:
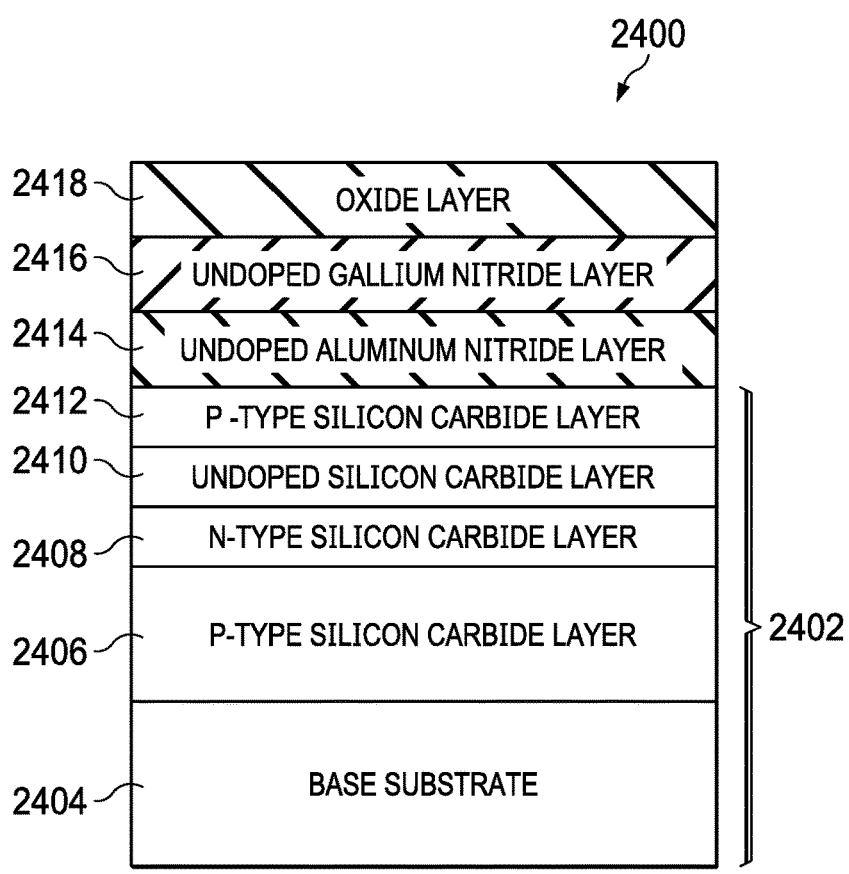
FIG. 24 is another example of a silicon carbide substrate with a set of group III nitride layers in accordance with an illustrative embodiment.

With reference next to FIG. 24, another example of a silicon carbide substrate with a set of group III nitride layers is depicted in accordance with an illustrative embodiment. In this illustrative example, workpiece 2400 is an example of layers that can be formed and bonded to a carrier substrate such as carrier substrate 500 in FIG. 5.

In this example, silicon carbide substrate 2402 in workpiece 2400 comprises base substrate 2404, p-type silicon carbide layer 2406, n-type silicon carbide layer 2408, undoped silicon carbide layer 2410, and p-type silicon carbide layer 2412. As depicted, p-type silicon carbide layer 2406 is a sacrificial layer for performing photo-electrochemical etching. The other silicon carbide layers are examples of silicon carbide device layers that can be used in forming semiconductor structures. In this example, n-type silicon carbide layer 2408 can function as an etch-stop in addition to being a device layer.

In this illustrative example, base substrate 2404 has a thickness of about 350 µm. As depicted, the sacrificial layer, p-type silicon carbide layer 2406, has a thickness of about 5 µm. In this example, n-type silicon carbide layer 2408 has a thickness of about 0.1 µm; undoped silicon carbide layer 2410 has a thickness of about 0.2 µm; and p-type silicon carbide layer 2412 has a thickness of about 0.1 µm.

As depicted, group III nitride layers are grown on p-type silicon carbide layer 2412 in silicon carbide substrate 2402. These group III nitride layers comprise undoped aluminum nitride layer 2414 and undoped gallium nitride layer 2416. In this illustrative example, undoped aluminum nitride layer 2414 has a thickness of about 0.1 µm, and undoped gallium nitride layer 2416 has a thickness of about 0.4 µm.

In this depicted example, oxide layer 2418 is deposited on undoped gallium nitride layer 2416. Oxide layer 2418 has a thickness of about 0.2 µm in this example.

With workpiece 2400, thin-films of silicon carbide and group III nitrides can be stacked on top of a material with a lower index of refraction (n) such as SiO2 such as n being about 1.4 for SiO2, 2.1/2.3 for monocrystalline AlN/GaN, and 2.6 for 4H-SiC, respectively. As a result, optical modes in a photonic device can stay within at least one of the silicon carbide or group III nitrides layers without radiating or losing optical energy into the bulk substrate material below.

Further, the silicon carbide layers in the group III nitride layers depicted in workpiece 2400 can be used to create a p-i-n junction within the silicon carbide material. In this example, the use of undoped aluminum nitride layer 2414 can be beneficial and can result in fewer un-passivated interface states (especially at cryogenic temperatures) compared to an exposed surface of SiC or a direct interface between silicon carbide and an oxide. The use of one or more additional group III nitride layers are optional in the illustrative examples.

The illustration of workpiece 2400 is provided as an example of one manner in which a silicon carbide substrate with a set of group III nitride layers can be implemented. This illustration is not meant to limit the manner in which other illustrative examples can be implemented.

For example, other illustrative examples can have other numbers of layers with the silicon carbide substrate. In some illustrative examples, the layer adjacent to the sacrificial layer can be an undoped layer rather than a layer with an opposite type of doping from the sacrificial layer. In yet another illustrative example, three, five, or some other number of group III nitride layers can be employed. Further, the example thicknesses for the layers are provided as examples of thicknesses that can be used with thin-film layers. Other thicknesses can be used in other examples.

Figure 25:
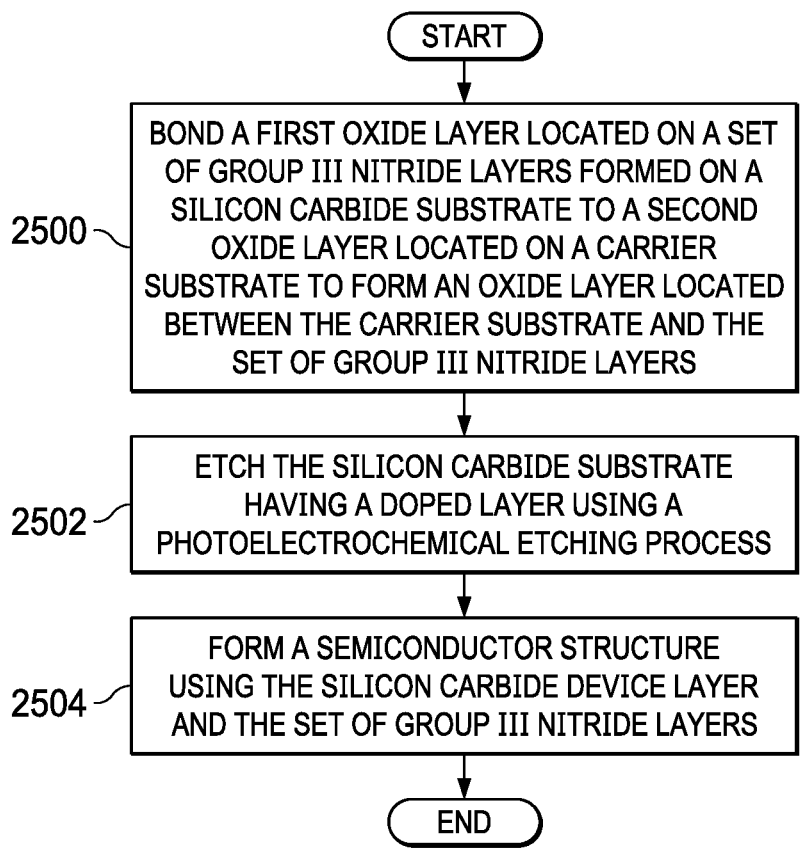
FIG. 25 is an illustration of a flowchart of a process for forming a semiconductor structure in accordance with an illustrative embodiment

Turning next to FIG. 25, an illustration of a flowchart of a process for forming a semiconductor structure is depicted in accordance with an illustrative embodiment. The process begins by bonding a first oxide layer located on a set of group III nitride layers formed on a silicon carbide substrate to a second oxide layer located on a carrier substrate to form an oxide layer located between the carrier substrate and the set of group III nitride layers (operation 2500). The silicon carbide substrate has a doped layer.

The process etches the silicon carbide substrate having the doped layer using a photo-electrochemical etching process (operation 2502). A doping level of the doped layer is such that the doped layer is removed and a silicon carbide device layer in the silicon carbide substrate remains unetched. In operation 2502, the doped layer is a sacrificial layer enabling forming the silicon carbide device layer on a substrate such as a wafer with at least one of a desired uniformity in a thickness of the silicon carbide device layer or a desired level of optical performance. In operation 2502, the photo-electrochemical etching is performed on an etch face which can be the silicon-face or, for this example, is a carbon-face of the silicon carbide material. The photo-electrochemical etching also can be performed on an etch face that is a silicon-face of the silicon carbide material.

The process forms a semiconductor structure using the silicon carbide device layer and the set of group III nitride layers (operation 2504). The process terminates thereafter. In this example, the silicon carbide device layer and the set of group III nitride layers can be thin-film layers. The semiconductor structure is selected from at least one of an optical waveguide, a slot waveguide, a ridge waveguide, a rib waveguide, a buried optical waveguide, a suspended waveguide, an optical resonator, a photon emitting quantum memory using a point defect within the silicon carbide device layer, or some other suitable structure. A semiconductor structure can include multiple components. For example, the semiconductor structure can include multiple waveguides of the same type or of different types. As another example, the semiconductor structure can include one or more waveguides and a quantum memory. These and other components can be selected to provide a desired function or functions for the semiconductor structure.

Figure 26:
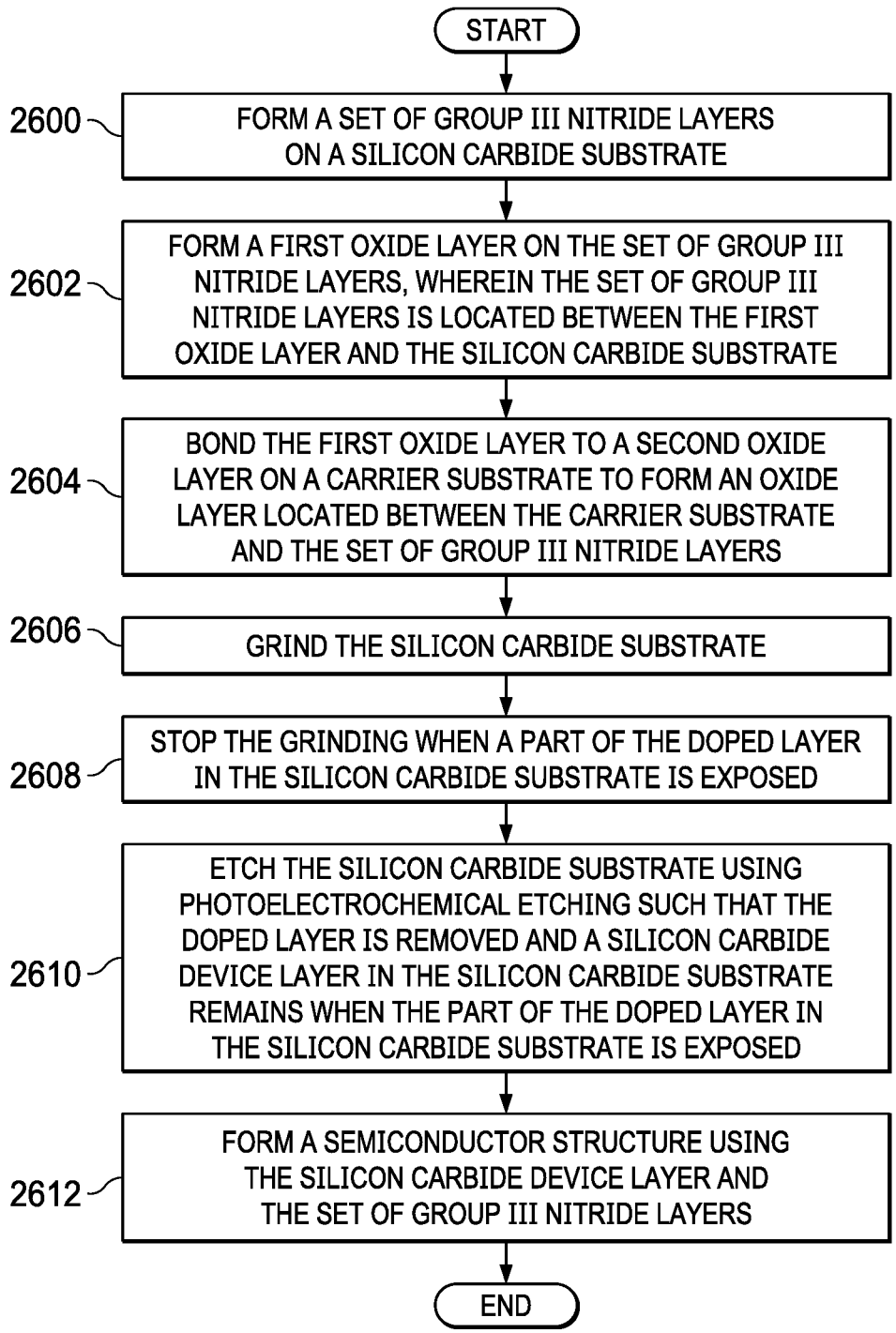
FIG. 26 is an illustration of a flowchart of a process for forming a semiconductor structure in accordance with an illustrative embodiment.

With reference next to FIG. 26, an illustration of a flowchart of a process for forming a semiconductor structure is depicted in accordance with an illustrative embodiment. The process begins by forming a set of group III nitride layers on a silicon carbide substrate (operation 2600). The silicon carbide substrate includes a doped layer. The doped layer has a doping level such that the doped layer is etched using a photo-electrochemical etching process while other portions of the silicon carbide substrate remain unetched. In other illustrative examples, forming of the set of group III nitride layers can include etching the set of group III nitride layers to form structures.

The process forms a first oxide layer on the set of group III nitride layers, wherein the set of group III nitride layers is located between the first oxide layer and the silicon carbide substrate (operation 2602). The process bonds the first oxide layer to a second oxide layer on a carrier substrate to form an oxide layer located between the carrier substrate and the set of group III nitride layers (operation 2604).

The process grinds the silicon carbide substrate (operation 2606). The process stops the grinding when a part of the doped layer in the silicon carbide substrate is exposed (operation 2608). In operation 2608, the part of the doped exposed layer can be the top portion of the doped layer or some portion within the doped layer.

The process etches the silicon carbide substrate using photo-electrochemical etching such that the doped layer is removed and a silicon carbide device layer in the silicon carbide substrate remains when the part of the doped layer in the silicon carbide substrate is exposed (operation 2610).

The process forms a semiconductor structure using the silicon carbide device layer and the set of group III nitride layers (operation 2612). The process terminates thereafter.

Figure 27:
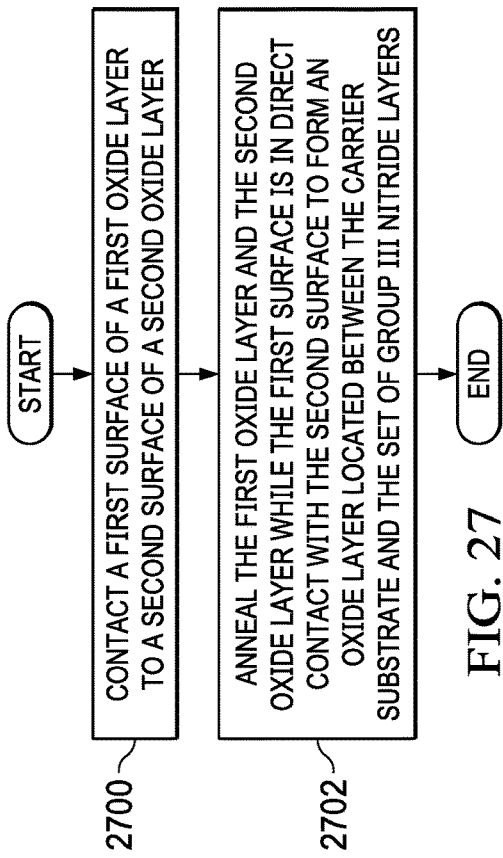
FIG. 27 is an illustration of a flowchart of a process for bonding components in accordance with an illustrative embodiment.

Turning next to FIG. 27, an illustration of bonding components is depicted in accordance with an illustrative embodiment. The flowchart in FIG. 27 is an example of one implementation for performing operation 2500 in FIG. 25 and operation 2604 in FIG. 26.

The process begins by contacting a first surface of a first oxide layer to a second surface of a second oxide layer (operation 2700). In operation 2700, intermolecular interactions occur between the first oxide layer and the second oxide layer. These intermolecular interactions include, for example, at least one of Van der Waals forces, hydrogen bonds, or strong covalent bonds.

The process anneals the first oxide layer and the second oxide layer while the first surface is in direct contact with the second surface to form an oxide layer located between a carrier substrate and a set of group III nitride layers (operation 2702). In this example, annealing in operation 2702 is optional. The process terminates thereafter.

Figure 28:
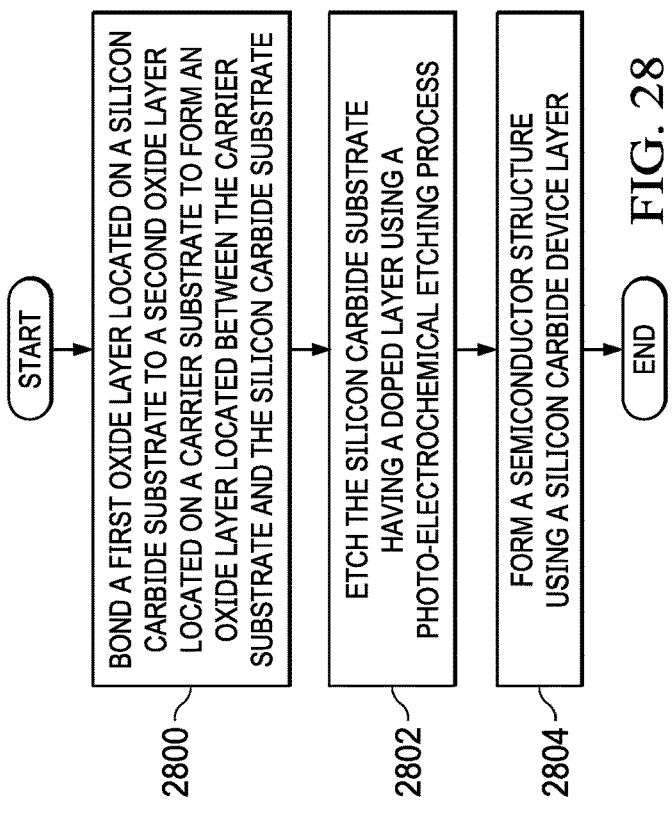
FIG. 28 is an illustration of a flowchart of a process for forming a semiconductor structure in accordance with an illustrative embodiment.

Turning to FIG. 28, an illustration of a flowchart of a process for forming a semiconductor structure is depicted in accordance with an illustrative embodiment. The process begins by bonding a first oxide layer located on a silicon carbide substrate to a second oxide layer located on a carrier substrate to form an oxide layer located between the carrier substrate and the silicon carbide substrate (operation 2800). In operation 2800, the silicon carbide substrate has a doped layer. Further, the first oxide layer is in direct contact with the silicon carbide substrate in one illustrative example. In another illustrative example, a set of intervening layers, such as a set of group III nitride layers, is located between the first silicon layer and the silicon carbide substrate.

The process etches the silicon carbide substrate having a doped layer using a photo-electrochemical etching process (operation 2802). In operation 2802, a doping level of the doped layer is such that the doped layer is removed and a silicon carbide device layer in the silicon carbide substrate remains unetched.

The process forms a semiconductor structure using a silicon carbide device layer (operation 2804). In operation 2804, other materials can also be used to form the semiconductor structure. For example, the set of group III layers or regions can be formed in this operation. Also, at least one of a cladding, a metal layer, or a metal region can also be formed in operation 2804 to form the semiconductor structure.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as instructions in program code, hardware, or a combination of the program code and hardware to control fabrication equipment for manufacturing semiconductor structures. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware to operate fabrication equipment to manufacture semiconductor structures.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

For example, the bonding performed in operation 2604 is shown as being performed prior to etching the silicon carbide substrate in operation 2610. In other illustrative examples, the bonding in operation 2604 can be performed after etching occurs in operation 2610. As another example, other dielectrics having desired properties, such as a desired dielectric constant, can be used in place of or in addition to the silicon dioxide shown and described for the figures.

Figure 29:
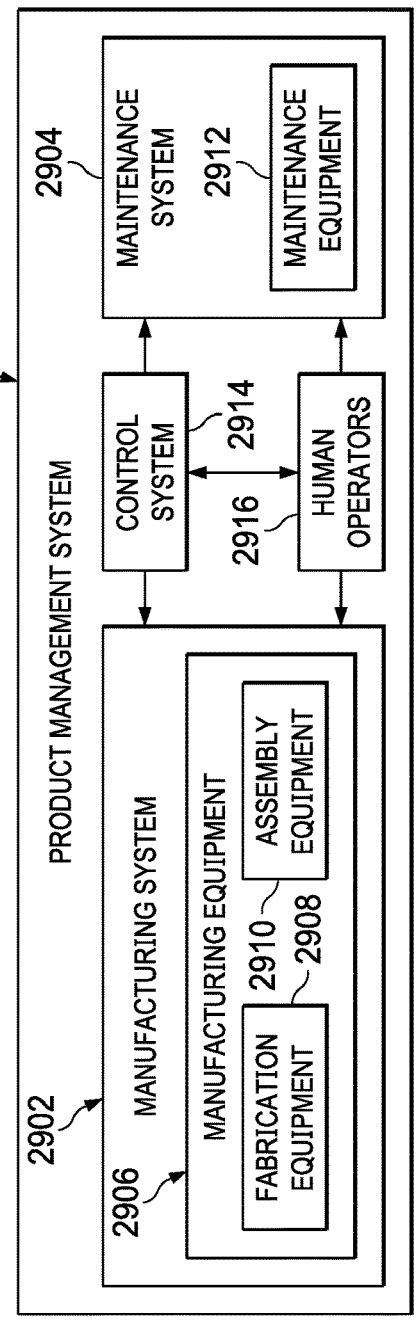
FIG. 29 is an illustration of a block diagram of a product management system in accordance with an illustrative embodiment.

Turning now to FIG. 29, an illustration of a block diagram of a product management system is depicted in accordance with an illustrative embodiment. Product management system 2900 is a physical hardware system. In this illustrative example, product management system 2900 includes at least one of manufacturing system 2902 or maintenance system 2904.

Manufacturing system 2902 is configured to manufacture products. As depicted, manufacturing system 2902 includes manufacturing equipment 2906. Manufacturing equipment 2906 includes at least one of fabrication equipment 2908 or assembly equipment 2910.

Fabrication equipment 2908 is equipment that used to fabricate components for parts used to form a product. Fabrication equipment 2908 can be used to fabricate at least one of metal parts, composite parts, semiconductors, circuits, fasteners, ribs, skin panels, spars, antennas, or other suitable types of parts.

For example, fabrication equipment 2908 can include machines and tools. These machines and tools can be at least one of a drill, a hydraulic press, a furnace, a mold, a composite tape laying machine, a vacuum system, a lathe, or other suitable types of equipment.

With respect to fabricating semiconductor components, fabrication equipment 2908 can comprise at least one of an epitaxial reactor, an oxidation system, a diffusion system, an etching machine, a cleaning machine, a bonding machine, a dicing machine, a wafer saw, an ion implantation machine, a physical vapor deposition system, a chemical vapor deposition system, a photolithography system, an electron-beam lithography system, a plasma etcher, a die attachment machine, a wire bonder, a die overcoat system, molding equipment, a hermetic sealer, an electrical tester, a burn-in oven, a retention bake oven, a UV erase machine, or other suitable types of equipment that can be used to manufacture semiconductor structures.

Assembly equipment 2910 is equipment used to assemble parts to form a product such as a chip, an integrated circuit, a computer, an aircraft, or some other product. Assembly equipment 2910 also can include machines and tools. These machines and tools may be at least one of a robotic arm, a crawler, a fastener installation system, a rail-based drilling system, or a robot.

In this illustrative example, maintenance system 2904 includes maintenance equipment 2912. Maintenance equipment 2912 can include any equipment needed to perform maintenance on a product. Maintenance equipment 2912 may include tools for performing different operations on parts on a product. These operations can include at least one of disassembling parts, refurbishing parts, inspecting parts, reworking parts, manufacturing replacement parts, or other operations for performing maintenance on the product. These operations can be for routine maintenance, inspections, upgrades, refurbishment, or other types of maintenance operations.

In the illustrative example, maintenance equipment 2912 may include ultrasonic inspection devices, x-ray imaging systems, vision systems, drills, crawlers, and other suitable devices. In some cases, maintenance equipment 2912 can include fabrication equipment 2908, assembly equipment 2910, or both to produce and assemble parts that needed for maintenance.

Product management system 2900 also includes control system 2914. Control system 2914 is a hardware system and may also include software or other types of components. Control system 2914 is configured to control the operation of at least one of manufacturing system 2902 or maintenance system 2904. In particular, control system 2914 can control the operation of at least one of fabrication equipment 2908, assembly equipment 2910, or maintenance equipment 2912.

The hardware in control system 2914 can be implemented using hardware that may include computers, circuits, networks, and other types of equipment. The control may take the form of direct control of manufacturing equipment 2906. For example, robots, computer-controlled machines, and other equipment can be controlled by control system 2914. In other illustrative examples, control system 2914 can manage operations performed by human operators 2916 in manufacturing or performing maintenance on a product. For example, control system 2914 can assign tasks, provide instructions, display models, or perform other operations to manage operations performed by human operators 2916. In these illustrative examples, the different steps described and illustrated for fabricating semiconductor structures using silicon carbide and group III nitride layers can be implemented using control system 2914.

In the different illustrative examples, human operators 2916 can operate or interact with at least one of manufacturing equipment 2906, maintenance equipment 2912, or control system 2914. This interaction can occur to manufacture semiconductor structures and other components for products such as semiconductor devices or components for use in products such as aircraft, spacecraft, communications systems, micro-electromechanical systems, photonic devices, or superconducting single photon detectors.

Thus, the illustrative examples provide a method, apparatus, and system for manufacturing semiconductor structures. In one illustrative example, a method forms a semiconductor structure. A first oxide layer located on a set of group III nitride layers formed on a silicon carbide substrate is bonded to a second oxide layer located on a carrier substrate to form an oxide layer located between the carrier substrate and the set of group III nitride layers. The silicon carbide substrate has a doped layer. The silicon carbide substrate having the doped layer is etched using a photo-electrochemical etching process, wherein a doping level of the doped layer is such that the doped layer is removed and a silicon carbide layer in the silicon carbide substrate remains unetched. The semiconductor structure is formed using the silicon carbide layer and the set of group III nitride layers.

Further, the processes in the illustrative examples are suitable for processing large-area wafers such as those that with an area of 10 cm2 or greater. The illustrative examples are compatible with currently used processes for these types of wafers to produce low-loss, high-thickness-uniformity silicon carbide and group III nitride-based crystalline structures on low-refractive-index insulators. This enables the production of active and passive integrated photonics and electronics in silicon carbide and group III nitrides.

For example, the illustrative example can include a combination of wafer bonding and then grinding/polishing or chemical-mechanical polishing for thinning the silicon carbide substrate, followed by photo-electrochemical etching from the carbon-face of the silicon carbide substrate. By making use of its material-selective etching property, the photo-electrochemical etching used in the listed example planarizes the silicon carbide layer into a clean crystal interface, resulting in a uniform silicon carbide film thickness.

To facilitate the photo-electrochemical etching, an electrode can be attached to another doped layer of the silicon carbide layer located beneath the surface being etched or the doped layer being etched and a second electrode can be located in the etching fluid. Applying photo-electrochemical etching in this way offers a different process for producing silicon carbide on insulator films compared to currently used techniques. Furthermore, the process in the illustrative example can be used to produce sub-micron thick films of silicon carbide and group III nitrides in a manner that preserves doped layers (e.g. p-i-n junctions) and structures beneath the exposed silicon carbide surface.

The resulting restructure can take many different forms in the illustrative examples. For example, without limitation, the semiconductor structure can be selected from at least one of an optical waveguide, a slot waveguide, a ridge waveguide, a rib waveguide, a buried optical waveguide, a suspended waveguide, an optical resonator, or a photon emitting quantum memory using a point defect within the silicon carbide device layer. In other words, the semiconductor structure can include one or more of these devices and can include multiple devices of the same type.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A semiconductor structure comprising:
   a substrate;
   an oxide layer on the substrate;
   a group III nitride layer on the oxide layer, the group III nitride layer defining a set of III nitride regions;
   a single crystalline 4H-SiC or 6H-SiC hexagonal crystal structure silicon carbide layer on the group III nitride layer, the silicon carbide layer defining a set of silicon carbide regions, at least one of the silicon carbide regions comprising a point defect selected from the group consisting of a divacancy, silicon monovacancy, other vacancy complex, transition metal ion, and a rare earth ion, the point defect having an associated electron spin state; and
   a cladding on the silicon carbide layer.

2. The semiconductor structure of claim 1, wherein the single crystalline 4H-SiC or 6H-SiC hexagonal crystal structure silicon carbide layer is in direct contact with the oxide layer.

3. The semiconductor structure of claim 1, wherein at least one of the silicon carbide regions is configured to emit a photon depending on the electron spin state associated with the point defect.

4. The semiconductor structure of claim 3, wherein a state of the photon is entangled to the electron spin state associated with the point defect.

5. The semiconductor structure of claim 1, wherein the single crystalline 4H-SiC or 6H-SiC hexagonal crystal structure silicon carbide layer comprises a silicon carbide region extending from the silicon carbide layer.

6. The semiconductor structure of claim 5 wherein the cladding has a lower refractive index than a refractive index for the single crystalline 4H-SiC or 6H-SiC hexagonal crystal structure silicon carbide layer.

7. The semiconductor structure of claim 6, wherein the cladding is comprised of a material selected from at least one of air, vacuum, resist, polymer, silicon dioxide, or silicon nitride.

8. The semiconductor structure of claim 1, wherein the single crystalline 4H-SiC or 6H-SiC hexagonal crystal structure silicon carbide layer comprises a set of thin-film layers.

9. The semiconductor structure of claim 1, wherein the substrate is one of a silicon carbide substrate, a silicon substrate, an aluminum oxide substrate, a gallium oxide substrate, a silica substrate, an aluminum nitride substrate, and a gallium nitride substrate.

* * * * *